(12) United States Patent
Han et al.

(10) Patent No.: US 12,287,960 B2
(45) Date of Patent: Apr. 29, 2025

(54) ELECTRONIC APPARATUS AND CONTROLLING METHOD THEREOF

(71) Applicant: SAMSUNG ELECTRONICS CO., LTD., Suwon-si (KR)

(72) Inventors: Sangjin Han, Suwon-si (KR);
Yonghwan Kwon, Suwon-si (KR);
Hyeonji Lee, Suwon-si (KR);
Seokhyun Kim, Suwon-si (KR);
Junggeun Kim, Suwon-si (KR);
Hyunsoo Yuk, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/131,728

(22) Filed: Apr. 6, 2023

(65) Prior Publication Data

US 2023/0400972 A1 Dec. 14, 2023

Related U.S. Application Data

(63) Continuation of application No. PCT/KR2023/002398, filed on Feb. 20, 2023.

(30) Foreign Application Priority Data

May 18, 2022 (KR) .................. 10-2022-0060925

(51) Int. Cl.
*G06F 3/04845* (2022.01)
*G06F 3/0354* (2013.01)
(Continued)

(52) U.S. Cl.
CPC ...... *G06F 3/04845* (2013.01); *G06F 3/03543* (2013.01); *G06F 3/03547* (2013.01); *G06F 3/0362* (2013.01); *G06F 3/048* (2013.01)

(58) Field of Classification Search
None
See application file for complete search history.

(56) References Cited

U.S. PATENT DOCUMENTS 8,935,630 B2    1/2015   Wroblewski
9,811,240 B2   11/2017   Kim et al.
(Continued)

FOREIGN PATENT DOCUMENTS

JP         2015-38661 A    2/2015
KR   10-2008-0024472 A    3/2008
(Continued)

OTHER PUBLICATIONS

Written Opinion (PCT/ISA/237) issued Jun. 21, 2023 by the International Searching Authority in International Application No. PCT/KR2023/002398.
(Continued)

*Primary Examiner* — Dorothy Harris
(74) *Attorney, Agent, or Firm* — Sughrue Mion, PLLC

(57) ABSTRACT

An electronic device includes a display and a processor configured to control the display to display a user interface (UI) screen including a plurality of graphical user interface (GUI) items and a focus GUI, identify, based on a wheel input of a user, arrangement information about the plurality of GUI items, identify, based on the arrangement information, a possible movement direction of the focus GUI displayed at a location corresponding to one GUI item among the plurality of GUI items, based on the identified possible movement direction of the focus GUI including both a horizontal direction and a vertical direction, identify a movement direction of the focus GUI as the horizontal direction, and control the display to move the focus GUI based on a manipulation direction of the wheel input and the identified movement direction.

20 Claims, 30 Drawing Sheets

(51) Int. Cl.
*G06F 3/0362* (2013.01)
*G06F 3/048* (2013.01)

(56) References Cited

U.S. PATENT DOCUMENTS

| | | | | |
|---|---|---|---|---|
| 9,870,114 | B1* | 1/2018 | Jones | G06F 3/0485 |
| 10,204,439 | B2 | 2/2019 | Heo et al. | |
| 10,235,791 | B2 | 3/2019 | Choi et al. | |
| 10,477,134 | B2 | 11/2019 | Lim et al. | |
| 10,929,005 | B2 | 2/2021 | Jung et al. | |
| 2003/0001898 | A1* | 1/2003 | Bernhardson | H04N 5/781 |
| | | | | 715/786 |
| 2004/0233238 | A1* | 11/2004 | Lahdesmaki | H04N 21/4622 |
| | | | | 715/810 |
| 2006/0184902 | A1* | 8/2006 | Hayes | G06F 3/04812 |
| | | | | 715/861 |
| 2006/0250358 | A1 | 11/2006 | Wroblewski | |
| 2007/0120819 | A1* | 5/2007 | Young | G06F 3/0485 |
| | | | | 345/156 |
| 2007/0159462 | A1* | 7/2007 | Yen | G06F 3/0362 |
| | | | | 345/163 |
| 2007/0236475 | A1* | 10/2007 | Wherry | G06F 3/04883 |
| | | | | 345/173 |
| 2007/0260994 | A1* | 11/2007 | Sciammarella | G06F 3/0482 |
| | | | | 715/769 |
| 2009/0049407 | A1* | 2/2009 | Casto | G06F 16/4387 |
| | | | | 715/828 |
| 2009/0102817 | A1* | 4/2009 | Bathiche | G06F 3/03543 |
| | | | | 345/184 |
| 2009/0158215 | A1 | 6/2009 | Ha et al. | |
| 2010/0058223 | A1* | 3/2010 | Price | H04N 21/4438 |
| | | | | 715/784 |
| 2010/0156675 | A1* | 6/2010 | Ganey | G06F 3/038 |
| | | | | 341/20 |
| 2010/0164908 | A1* | 7/2010 | Hill | G06F 3/0362 |
| | | | | 345/184 |
| 2010/0211872 | A1* | 8/2010 | Rolston | G06F 3/0488 |
| | | | | 715/830 |
| 2010/0281430 | A1* | 11/2010 | Safar | G06F 3/0488 |
| | | | | 715/834 |
| 2013/0290116 | A1* | 10/2013 | Hepworth | G06Q 30/0241 |
| | | | | 705/14.73 |
| 2013/0335767 | A1 | 12/2013 | Ha et al. | |
| 2015/0100923 | A1 | 4/2015 | Wroblewski | |
| 2015/0106765 | A1* | 4/2015 | Lee | G06F 3/0482 |
| | | | | 715/810 |
| 2016/0357987 | A1 | 12/2016 | Heo et al. | |
| 2016/0364897 | A1 | 12/2016 | Choi et al. | |
| 2017/0083178 | A1* | 3/2017 | Kirov | G06F 3/0482 |
| 2023/0314801 | A1* | 10/2023 | Bove, Jr. | G06F 3/04815 |
| | | | | 359/13 |

FOREIGN PATENT DOCUMENTS

| | | |
|---|---|---|
| KR | 10-0958490 B1 | 5/2010 |
| KR | 10-2010-0109277 A | 10/2010 |
| KR | 10-1405998 B1 | 6/2014 |
| KR | 10-2015-0101909 A | 9/2015 |
| KR | 10-2016-0037449 A | 4/2016 |
| KR | 10-2016-0085662 A | 7/2016 |
| KR | 10-2016-0147578 A | 12/2016 |
| KR | 10-2018-0075989 A | 7/2018 |
| KR | 10-2018-0082812 A | 7/2018 |
| KR | 10-2135092 B1 | 7/2020 |
| KR | 10-2021-0127337 A | 10/2021 |
| WO | 2006/020304 A2 | 2/2006 |

OTHER PUBLICATIONS

International Search Report (PCT/ISA/210) issued Jun. 21, 2023 by the International Searching Authority in International Application No. PCT/KR2023/002398.

Communication dated Feb. 26, 2025 issued by the European Patent Office in European Patent Application No. 23807745.7.

* cited by examiner

FIG. 22

> peace
>
> Ah, that Time could touch a form
> That could show what Homer's age
> Bred to be a hero's wage.
> 'Were not all her life but storm —— 2211
> Would not painters paint a form
> Of such noble lines,' I said,
> 'Such a delicate high head, depth 1 depth 2 | previous | next | —— 2212

| APP BEING EXECUTED | LEFT/RIGHT WHEEL INPUT |
|---|---|
| TV PLAYER | CHANNEL UP/DOWN |
| SETUP BOX (MBR SETUP) | CHANNEL UP/DOWN |
| SHOW VOLUME UI | VOLUME UP/DOWN |
| MUSIC PLAYER | PLAY PREVIOUS/NEXT SONG |
| VIDEO PLAYER | FF/REW |
| PHOTO APPLICATION | SHOW PREVIOUS /NEXT PHOTO |
| CONTENT PLAYER | FF/REW |
| WEB BROWSER | SCROLL UP/DOWN |

2810

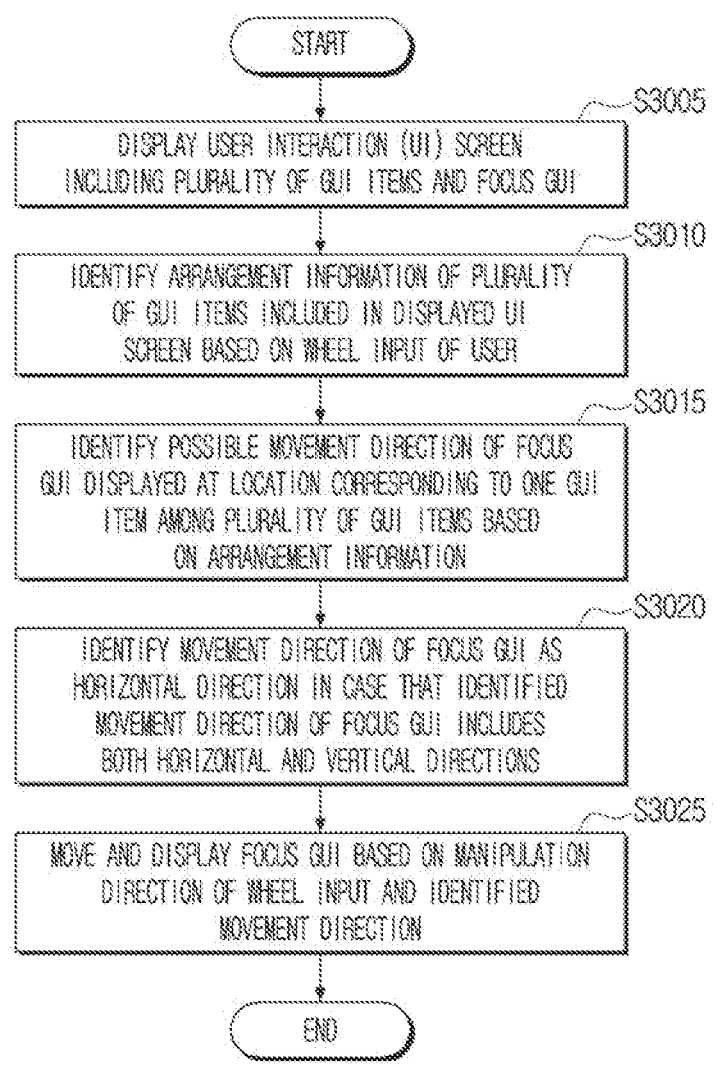

ELECTRONIC APPARATUS AND CONTROLLING METHOD THEREOF

CROSS-REFERENCE TO RELATED APPLICATION

This application is a bypass continuation of International Application No. PCT/KR2023/002398, filed on Feb. 20, 2023, in the Korean Intellectual Property Receiving Office, which is based on and claims priority to Korean Patent Application No. 10-2022-0060925, filed on May 18, 2022, in the Korean Intellectual Property Office, the disclosures of which are incorporated by reference herein in their entireties.

BACKGROUND

1. Field

The disclosure relates to an electronic apparatus and a controlling method thereof, and more particularly, to an electronic apparatus which may move and display a focus graphic user interface (GUI) on a UI screen where a plurality of GUI items are displayed, and a controlling method thereof.

2. Description of Related Art

A focus user interface (UI) may be displayed on a UI screen of an electronic apparatus to easily notify a user of which graphic user interface (GUI) item to select from the plurality of displayed GUI items. The focus GUI (or the focus UI) may refer to a UI indicating a currently activated item. The user may recognize a selectable GUI item based on a location where the focus GUI is displayed. In addition, the user may finally decide which GUI item to select by changing a display of the focus GUI.

The electronic apparatus may receive a wheel input while the UI screen including at least one GUI item and the focus GUI is displayed. The wheel input may refer to a user input related to a mouse wheel button. The electronic apparatus may switch pages or change the activated GUI items based on the wheel input. The electronic apparatus may also change the location of the focus GUI.

However, when the plurality of GUI items exist, the user may not easily predict at which location the focus GUI is supposed to be displayed based on the wheel input. In case that the wheel input is received in a vertical direction while the GUI item is movable in both horizontal and vertical directions, the user may be confused as to whether the focus GUI is moved in the horizontal direction or the vertical direction.

SUMMARY

Provided are an electronic apparatus which may determine a movement direction of a focus user interface (UI) based on a direction in which a graphic user interface (GUI) item is movable, and a controlling method thereof.

Additional aspects will be set forth in part in the description which follows and, in part, will be apparent from the description, or may be learned by practice of the presented embodiments.

According to an aspect of the disclosure, an electronic device may include a display and a processor configured to control the display to display a UI screen including a plurality of GUI items and a focus GUI, identify, based on a wheel input of a user, arrangement information about the plurality of GUI items, identify, based on the arrangement information, a possible movement direction of the focus GUI displayed at a location corresponding to one GUI item among the plurality of GUI items, based on the identified possible movement direction of the focus GUI including both a horizontal direction and a vertical direction, identify a movement direction of the focus GUI as the horizontal direction, and control the display to move the focus GUI based on a manipulation direction of the wheel input and the identified movement direction.

The processor may be further configured to, based on the wheel input and while the focus GUI is displayed at a first location corresponding to a first GUI item among the plurality of GUI items, identify the manipulation direction of the wheel input, based on the manipulation direction of the wheel input being identified as a first direction, control the display to move the focus GUI to a second location corresponding to a second GUI item displayed on a first side of the first GUI item, and based on the manipulation direction of the wheel input being identified as a second direction, control the display to move the focus GUI to a third location corresponding to a third GUI item displayed on a second side of the first GUI item.

The processor may be further configured to, control the display to move the focus GUI to the second location corresponding to the second GUI item based on a depth of the second GUI item being the same as a depth of the first GUI item, and control the display to move the focus GUI to the third location corresponding to the third GUI item based on a depth of the third GUI item being the same as the depth of the first GUI item.

The processor may be further configured to, control the display to display a UI indicating that the focus GUI is unable to be moved based on the depth of the second GUI item being different from the depth of the first GUI item, and control the display to display the UI indicating that the focus GUI is unable to be moved based on the depth of the third GUI item being different from the depth of the first GUI item.

The arrangement information may include at least one of an arrangement shape of the plurality of GUI items and an arrangement location of the plurality of GUI items.

The processor may be further configured to, based on the arrangement information including priority information for each of the plurality of GUI items, control the display to move the focus GUI based on the priority information for each of the plurality of GUI items and the manipulation direction of the wheel input.

The processor may be further configured to acquire identification information about an application providing the UI screen based on a predetermined event and identify the movement direction of the focus GUI as the horizontal direction based on the identification information about the application.

The processor may be further configured to, based on the identified possible movement direction of the focus GUI being the vertical direction, control the display to move the focus GUI upward or downward according to the manipulation direction of the wheel input, and based on the identified possible movement direction of the focus GUI being the horizontal direction, control the display to move the focus GUI to left or right according to the manipulation direction of the wheel input.

The processor may be further configured to, based on a sub-UI including text mapped to a direction key being displayed on the UI screen, control the display to not move the focus GUI based on the wheel input.

The wheel input may be received through at least one of a wheel button and a touch panel.

According to an aspect of the disclosure, a controlling method of an electronic apparatus may include displaying a UI screen including a plurality of GUI elements and a focus GUI, identifying, based on a wheel input of a user, arrangement information about the plurality of GUI items, identifying, based on the arrangement information, a possible movement direction of the focus GUI displayed at a location corresponding to one GUI item among the plurality of GUI items, based on the identified possible movement direction of the focus GUI including both a horizontal direction and a vertical direction, identifying a movement direction of the focus GUI as the horizontal direction, and moving the focus GUI based on a manipulation direction of the wheel input and the identified movement direction.

The moving of the focus GUI may include, based on the wheel input and while the focus GUI is displayed at a first location corresponding to a first GUI item among the plurality of GUI items, identifying the manipulation direction of the wheel input, based on the manipulation direction of the wheel input being identified as a first direction, moving the focus GUI to a second location corresponding to a second GUI item displayed on a first side the first GUI item, and based on the manipulation direction of the wheel input being identified as a second direction, moving the focus GUI to a third location corresponding to a third GUI item displayed on a second the first GUI item.

The method may include moving the focus GUI to the second location corresponding to the second GUI item based on a depth of the second GUI item being the same as a depth of the first GUI item, and moving the focus GUI to the third location corresponding to the third GUI item based on a depth of the third GUI item being the same as the depth of the first GUI item.

The method may include displaying a UI indicating that the focus GUI is unable to be moved based on the depth of the second GUI item being different from the depth of the first GUI item and displaying the UI indicating that the focus GUI is unable to be moved based on the depth of the third GUI item being different from the depth of the first GUI item.

The arrangement information may include at least one of an arrangement shape of the plurality of GUI items and an arrangement location of the plurality of GUI items.

According to an aspect of the disclosure, a non-transitory computer-readable storage medium may store instructions that, when executed by at least one processor, cause the at least one processor to control a display to display a UI screen including a plurality of GUI items and a focus GUI, identify, based on a wheel input of a user, arrangement information about the plurality of GUI items, identify, based on the arrangement information, a possible movement direction of the focus GUI displayed at a location corresponding to one GUI item among the plurality of GUI items, based on the identified possible movement direction of the focus GUI including both a horizontal direction component and a vertical direction component, identify a movement direction of the focus GUI as a horizontal direction, and control the display to move the focus GUI based on the wheel input and the identified movement direction.

The instructions, when executed, may further cause the at least one processor to, while the focus GUI is displayed at a first location corresponding to a first GUI item among the plurality of GUI items, identify the manipulation direction of the wheel input, based on the manipulation direction of the wheel input being identified as a first direction, control the display to move the focus GUI to a second location corresponding to a second GUI item displayed on a first side of the first GUI item, and based on the manipulation direction of the wheel input being identified as a second direction, control the display to move the focus GUI to a third location corresponding to a third GUI item displayed on a second side of the first GUI item.

The instructions, when executed, may further cause the at least one processor to control the display to move the focus GUI to the second location corresponding to the second GUI item based on a depth of the second GUI item being the same as a depth of the first GUI item, and control the display to move the focus GUI to the third location corresponding to the third GUI item based on a depth of the third GUI item being the same as the depth of the first GUI item.

The instructions, when executed, may further cause the at least one processor to control the display to display a UI indicating that the focus GUI is unable to be moved based on the depth of the second GUI item being different from the depth of the first GUI item, and control the display to display the UI indicating that the focus GUI is unable to be moved based on the depth of the third GUI item being different from the depth of the first GUI item.

The arrangement information may include at least one of an arrangement shape of the plurality of GUI items and an arrangement location of the plurality of GUI items.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 22 is a diagram showing an operation of moving the focus GUI in a situation where the GUI item of a different depth exists in various examples according to an embodiment of the disclosure;

FIG. 28 is a diagram showing a control operation corresponding to the wheel input based on an application being executed according to an embodiment of the disclosure;

FIG. 30 is a flowchart showing a controlling method of an electronic apparatus according to an embodiment of the disclosure.

DETAILED DESCRIPTION

Figure 1:
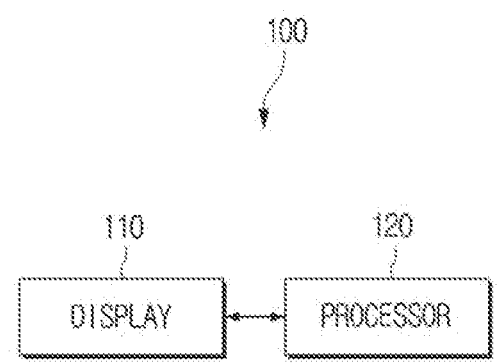
FIG. 1 is a block diagram showing an electronic apparatus according to an embodiment of the disclosure.

Hereinafter, the disclosure is described in detail with reference to the accompanying drawings.

General terms that are currently widely used are selected as terms used in embodiments of the disclosure in consideration of functions in the disclosure, and may be changed based on the intentions of those skilled in the art or a judicial precedent, the emergence of a new technique, and the like. In addition, in a specific case, terms arbitrarily chosen by an applicant may exist. In this case, the meanings of such terms are mentioned in detail in corresponding description portions of the disclosure. Therefore, the terms used in the disclosure need to be defined on the basis of the meanings of the terms and the contents throughout the disclosure rather than simple names of the terms.

In the disclosure, an expression "have," "may have," "include," "may include" or the like, indicates the existence of a corresponding feature (for example, a numerical value, a function, an operation, or a component such as a part), and does not exclude the existence of an additional feature.

An expression, "at least one of A or/and B" may indicate either "A or B," or "both of A and B."

Expressions "first," "second," or the like, used in the disclosure may qualify various components regardless of a sequence and/or importance of the components. These expressions are used only to distinguish one component from the other components, and do not limit the corresponding components.

In case that any component (for example, a first component) is mentioned to be "(operatively or communicatively) coupled with/to" or "connected to" another component (for example, a second component), it is to be understood that the any component may be directly coupled to the another component or may be coupled to the another component through still another component (for example, a third component).

A term of a singular number may include its plural number unless explicitly indicated otherwise in the context. It is to be understood that a term "include" or "formed of" used in the specification specifies the presence of features, numerals, steps, operations, components, parts or combinations thereof, which is mentioned in the specification, and does not preclude the presence or addition of one or more other features, numerals, steps, operations, components, parts or combinations thereof.

In the disclosure, a "module" or a "~er/~or" may perform at least one function or operation, and be implemented by hardware or software, or be implemented by a combination of hardware and software. In addition, a plurality of "modules" or a plurality of "~ers/~ors" may be integrated in at least one module and implemented by at least one processor except for a "module" or a "~er/or" that needs to be implemented by specific hardware.

In the specification, such a term as a "user" may refer to a person who uses an electronic device or a device (e.g., an artificial intelligence electronic device) which uses an electronic device (e.g., movable robot).

Hereinafter, the embodiments of the disclosure are described in detail with reference to the accompanying drawings.

FIG. 1 is a block diagram showing an electronic apparatus according to an embodiment of the disclosure. In the description of FIG. 1, reference will be made to various components described with respect to FIGS. 2-30.

Referring to FIG. 1, the electronic apparatus 100 may include a display 110 and a processor 120.

The electronic apparatus 100 according to an embodiment of the disclosure may include, for example, at least one of a smartphone, a tablet personal computer (PC), a mobile phone, a desktop PC, a laptop PC, a personal digital assistant (PDA), or a portable multimedia player (PMP). In some examples, the electronic apparatus 100 may include, for example, at least one of a television, a digital video disk (DVD) player, or a media box (e.g., Samsung HomeSync™, Apple TV™, or Google TV™).

The display 110 may be implemented in various types of displays such as a liquid crystal display (LCD), an organic light emitting diode (OLED) display, and a plasma display panel (PDP). The display 110 may include a driving circuit, a backlight unit, and the like, which may be implemented in a form such as an amorphous silicon thin film transistor (a-si TFT), a low temperature poly silicon (LTPS) TFT, or an organic TFT (OTFT). The display 110 may be implemented as a touch screen combined with a touch sensor, a flexible display, a three-dimensional (3D) display, or the like. In addition, the display 110 according to an embodiment of the disclosure may include not only a display panel outputting an image but also a bezel housing the display panel. In particular, the bezel according to an embodiment of the disclosure may include a touch sensor for detecting user interface.

The processor 120 may perform an overall control operation of the electronic apparatus 100. In detail, the processor 120 may function to control overall operations of the electronic apparatus 100.

The processor 120 may be implemented as a digital signal processor (DSP), a microprocessor, or a time controller (TCON), which processes a digital signal. However, the processor 120 is not limited thereto. The processor 120 may include one or more of a central processing unit (CPU), a micro controller unit (MCU), a micro processing unit (MPU), a controller, an application processor (AP), a graphics-processing unit (GPU), a communication processor (CP) and an advanced reduced instruction set computer (RISC) machines (ARM) processor, or may be defined by these terms. In addition, the processor 120 may be implemented in a system-on-chip (SoC) or a large scale integration (LSI), in which a processing algorithm is embedded, or may be implemented in the form of a field programmable gate array (FPGA). In addition, the processor 120 may perform various functions by executing computer executable instructions stored in a memory 140.

The processor 120 may control the display 110 to display a user interface (UI) screen including a plurality of graphic user interface (GUI) items and a focus GUI, identify arrangement information about the plurality of GUI items included in the displayed UI screen based on receiving a wheel input of a user while the UI screen is displayed, identify a possible movement direction of the focus GUI displayed at a location corresponding to one GUI item among the plurality of GUI items based on the arrangement information, identify a movement direction of the focus GUI as a horizontal direction in case that the identified possible movement direction of the focus GUI includes both the horizontal and vertical directions, and control the display 110 to move and display the focus GUI based on a manipulation direction of the wheel input and the identified movement direction.

The processor 120 may display the UI screen. The UI screen may include at least one GUI item. The GUI item may indicate a UI that represents an item (or object) selectable by the user. For example, the GUI items may indicate the GUI items 311 to 315 of FIG. 3 and the like.

In addition, the UI screen may include the focus GUI. The focus GUI may include a UI for indicating a currently activated (or selectable) GUI item.

The user may easily find the currently activated (or selectable) GUI item based on the location where the focus GUI is displayed on the UI screen including at least one GUI item.

The processor 120 may acquire information indicating that the wheel input (or information about the wheel input) is received while the UI screen including at least one GUI item and the focus GUI is displayed. The wheel input may indicate a user input through a wheel button or a wheel UI. The wheel input may include an upward wheel input, a downward wheel input, a left wheel input, a right wheel input, or the like, based on the manipulation direction. In addition, the wheel input may be referred to as a scroll input or the like.

The wheel input may be received through at least one of the wheel button or a touch panel. The wheel button may be a physical button included in an external input device 200 such as a mouse. A detailed description of the wheel input is described with reference to FIGS. 5 and 6.

The processor 120 may acquire the arrangement information about the plurality of GUI items based on receiving the wheel input of the user.

The arrangement information may include a variety of information about arrangement of the GUI items. The arrangement information may include at least one of arrangement shape information about the plurality of GUI items, arrangement location information about the plurality of GUI items, or arrangement sequence information (or priority information) of the plurality of GUI items.

The processor 120 may display the focus GUI at the location corresponding to the GUI item based on the arrangement information. The processor 120 may identify a direction in which the displayed focus GUI is movable. The possible movement direction of the focus GUI may be a direction in which the displayed focus GUI is movable in a current state. The possible movement direction may be either the vertical direction or the horizontal direction. The vertical direction may be classified as an up-down direction, and the horizontal direction may be classified as a left-right direction. A detailed description thereof is described with reference to FIGS. 9 and 10.

In addition, the processor 120 may acquire the location of the GUI item at which the currently focused UI is displayed, and acquire location of a nearby GUI item based on the acquired GUI location. In addition, the processor 120 may identify the possible movement direction based on the location of the GUI item at which the currently focused UI is displayed and the location of the nearby GUI item. The processor 120 may exclude, from an operation of calculating the possible movement direction, a GUI item to which the focus GUI is unable to be moved (for example, a GUI item having a different depth) even though the corresponding GUI item is the nearby GUI item.

The processor 120 may identify (or determine) the movement direction of the focus GUI as a predetermined direction in case that the possible movement direction of the focus GUI includes both the horizontal and vertical directions. The predetermined direction may be the horizontal direction. However, the predetermined direction may be changed based on a user setting or another event. For example, the predetermined direction may be either the horizontal direction or the vertical direction.

The processor 120 may determine the location where the focus GUI is displayed based on the identified movement direction of the focus GUI and the manipulation direction of the wheel input. In addition, the processor 120 may control the display 110 to display the UI screen displaying the focus GUI at the determined location.

The processor 120 may fix the movement direction of the focus GUI to one direction based on determining that the focus GUI is movable in both the horizontal and vertical directions.

In general, in a state where the focus GUI is movable in both the horizontal and vertical directions, the electronic apparatus 100 may move the focus GUI in the vertical direction based on receiving the vertical wheel input (i.e., scroll input in an upward direction or scroll input in a downward direction), and move the focus GUI in the horizontal direction based on receiving the horizontal wheel input (i.e., scroll input in a left direction or scroll input in a right direction).

However, in case that the possible movement direction of the focus GUI 10 includes both the horizontal and vertical directions, the electronic apparatus 100 or the processor 120 may move the focus GUI in the horizontal direction even when receiving the vertical wheel input (i.e., scroll input in the upward direction or scroll input in the downward direction). In this situation, the electronic apparatus 100 may move the focus GUI in the horizontal direction based on receiving the horizontal wheel input (i.e., scroll input in the left direction or scroll input in the right direction).

The manipulation direction of the wheel input may be one of the upward direction, the downward direction, the left direction, or the right direction. The processor 120 may move the focus GUI based on the manipulation direction of the wheel input.

In an example where only the manipulation direction of the wheel input is considered, the processor 120 may move and display the focus GUI in the upward direction, the downward direction, the left direction, or the right direction in case that the manipulation direction of the wheel input is the upward direction, the downward direction, the left direction, or the right direction, respectively.

However, in an example where both the manipulation direction of the wheel input and the movement direction (assuming the horizontal direction) of the focus GUI are considered, the processor 120 may move and display the focus GUI in the left direction, the right direction, the left direction, or the right direction in case that the manipulation direction of the wheel input is the upward direction, the downward direction, the left direction, or the right direction, respectively.

In another example, it may be assumed that the predetermined direction is the vertical direction rather than the horizontal direction. In an example where both the manipulation direction of the wheel input and the movement direction (assuming the vertical direction) of the focus GUI are considered, the processor 120 may move and display the focus GUI in the upward direction, the downward direction, the upward direction, or the downward direction in case that the manipulation direction of the wheel input is the upward direction, the downward direction, the left direction, or the right direction, respectively.

The processor 120 may identify the manipulation direction of the wheel input based on receiving the wheel input while the focus GUI is displayed at a first location corresponding to a first GUI item among the plurality of GUI items, control the display 110 to move and display the focus GUI at a second location corresponding to a second GUI item displayed on the right of the first GUI item in case that the manipulation direction of the wheel input is a first direction, and control the display 110 to move and display the focus GUI at a third location corresponding to a third GUI item displayed on the left of the first GUI item in case that the manipulation direction of the wheel input is a second direction.

The processor 120 may display the focus GUI at the first location corresponding to the first GUI item. In addition, the processor 120 may receive the wheel input while the focus GUI is displayed at the first location. It may be determined whether the focus GUI is moved in the left direction or the right direction based on the manipulation direction of the wheel input.

The processor 120 may identify the second GUI item displayed on the right of the first GUI item in case that the manipulation direction of the wheel input is the first direction. In addition, the processor 120 may identify the second location corresponding to the second GUI item. In addition, the processor 120 may control the display 110 to display the focus GUI at the second location.

The processor 120 may identify the third GUI item displayed on the left of the first GUI item in case that the manipulation direction of the wheel input is the second direction opposite to the first direction. In addition, the processor 120 may identify the third location corresponding to the third GUI item. In addition, the processor 120 may control the display 110 to display the focus GUI 10 at the third location.

An operation of changing the location where the focus GUI 10 is displayed is described with reference to FIG. 8.

The processor 120 may control the display 110 to move and display the focus GUI at the second location corresponding to the second GUI item in case that a depth of the second GUI item is the same as a depth of the first GUI item, and control the display 110 to move and display the focus GUI at the third location corresponding to the third GUI item in case that a depth of the third GUI item is the same as the depth of the first GUI item.

The processor 120 may compare a depth of the GUI item (e.g., first GUI item) corresponding to the location where the focus GUI is currently displayed with a depth of the GUI item (e.g., second GUI item or third GUI item) corresponding the location to which the focus GUI is moved. In addition, the processor 120 may determine whether to finally move and display the focus GUI based on a comparison result.

The processor 120 may move the focus GUI only for a GUI item corresponding to the same depth. The reason is that the user may be confused in manipulating a menu in case that the focus GUI is moved to a different depth.

The processor 120 may control the display 110 to display a UI guiding that the focus GUI is unable to be moved based on the wheel input in case that the depth of the second GUI item is different from the depth of the first GUI item, and control the display 110 to display the UI guiding that the focus GUI is unable to be moved based on the wheel input in case that the depth of the third GUI item is different from the depth of the first GUI item.

The processor 120 may control the display 110 to display the guide UI for notifying that the focus GUI is unable to be moved in case that the depth of the GUI item (e.g., first GUI item) corresponding to the location where the focus GUI is currently displayed is not the same as the depth of the GUI item (e.g., second GUI item or third GUI item) corresponding to the location to which the focus GUI is moved.

For example, the guide UI may include text information indicating that the focus GUI is unable to be moved. The guide UI may include text such as "Focus GUI cannot be moved."

For another example, the guide UI may include both the text information indicating that the focus GUI is unable to be moved and information about a location where the focus GUI is unable to be moved. The guide UI may include text such as "Focus GUI cannot be moved to the second GUI item."

An operation of determining whether to move the focus GUI by comparing the depths of the GUI items is described with reference to FIGS. 11 to 15.

The arrangement information may include at least one of an arrangement shape of the plurality of GUI items and an arrangement location of the plurality of GUI items.

The arrangement shape of the GUI items may indicate either their arrangement structure or arrangement shape. The arrangement location of GUI items may indicate coordinates at which the GUI items are displayed.

Figure 3:
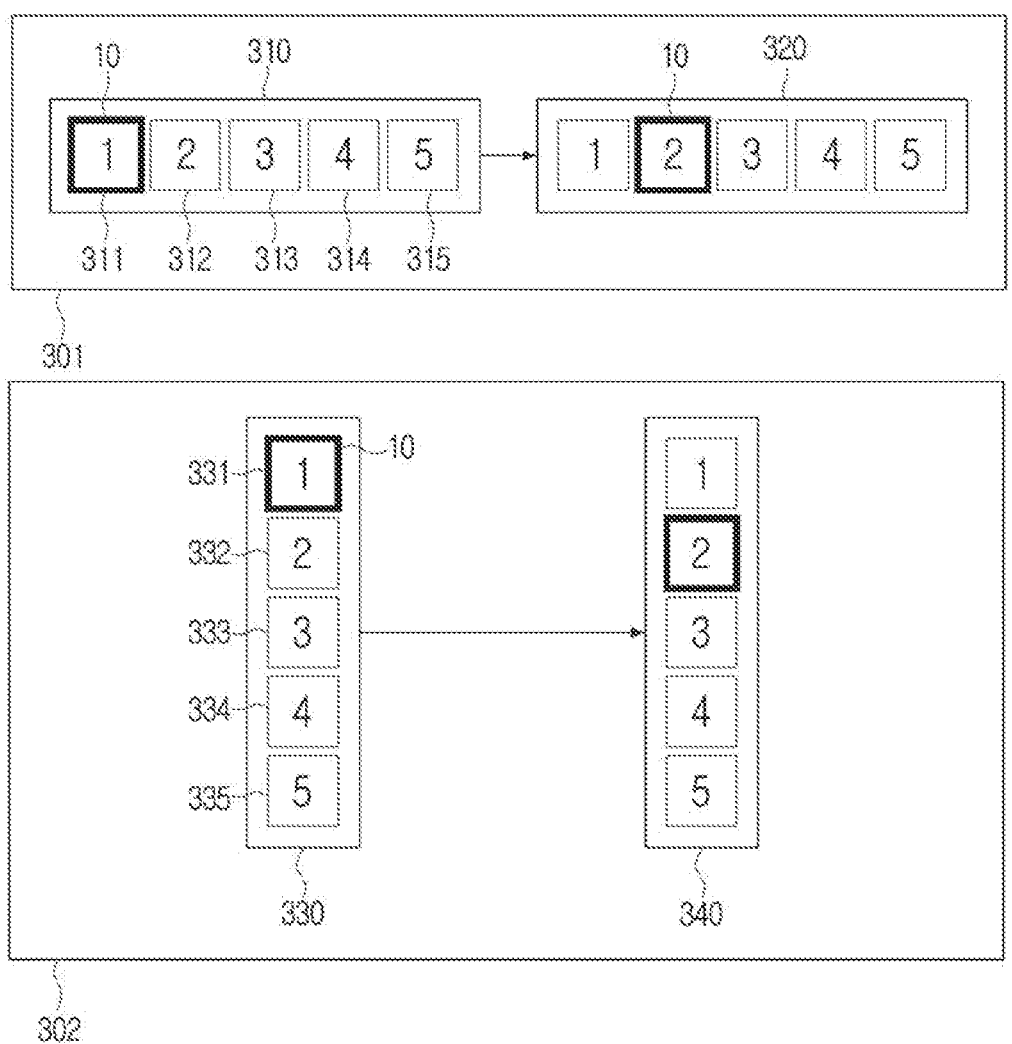
FIG. 3 is a diagram showing a plurality of graphic user interface (GUI) items arranged in a horizontal direction and a plurality of GUI items arranged in a vertical direction according to an embodiment of the disclosure.
Figure 9:
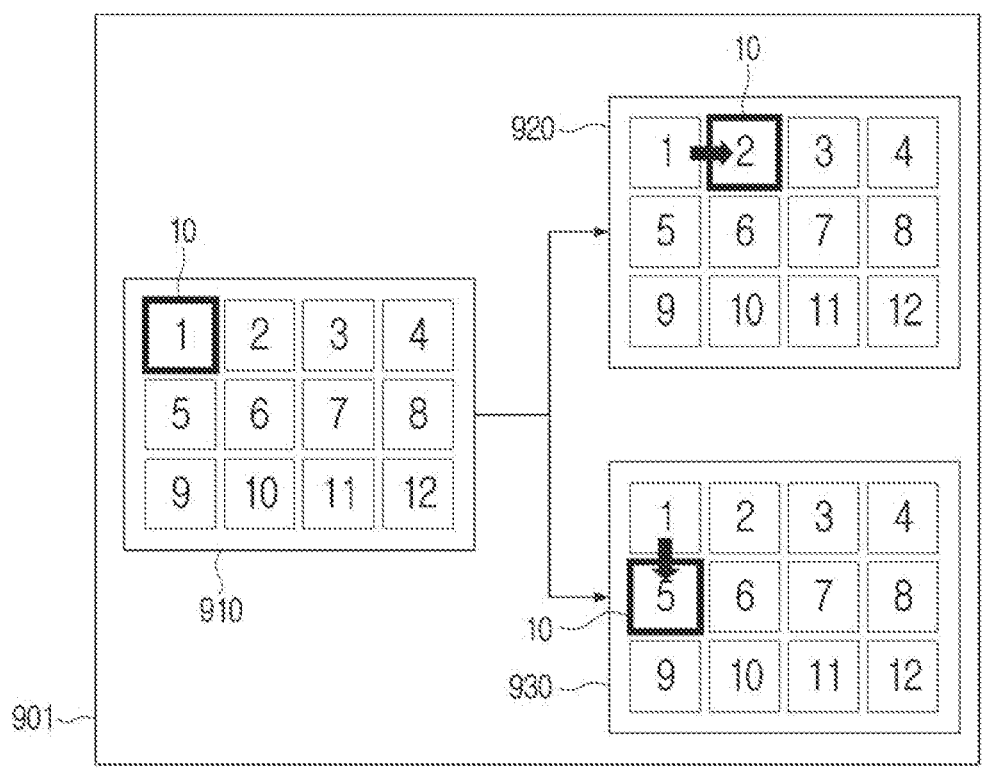
FIG. 9 is a diagram showing a possible movement direction of the focus GUI according to an embodiment of the disclosure.

For example, example 301 of FIG. 3 shows the GUI items arranged in the horizontal direction, and the arrangement information may include information about their structure (or shape) in the horizontal direction. Example 302 of FIG. 3 shows the GUI items arranged in the vertical direction, and the arrangement information may include information about their structure (or shape) in the vertical direction. Example 901 of FIG. 9 shows the GUI items arranged in a 3*4 matrix, and the arrangement information may include information about their structure (or shape) of the 3*4 matrix.

The arrangement information may further include the arrangement sequence information. The arrangement sequence information may be referred to as the priority information.

Figure 18:
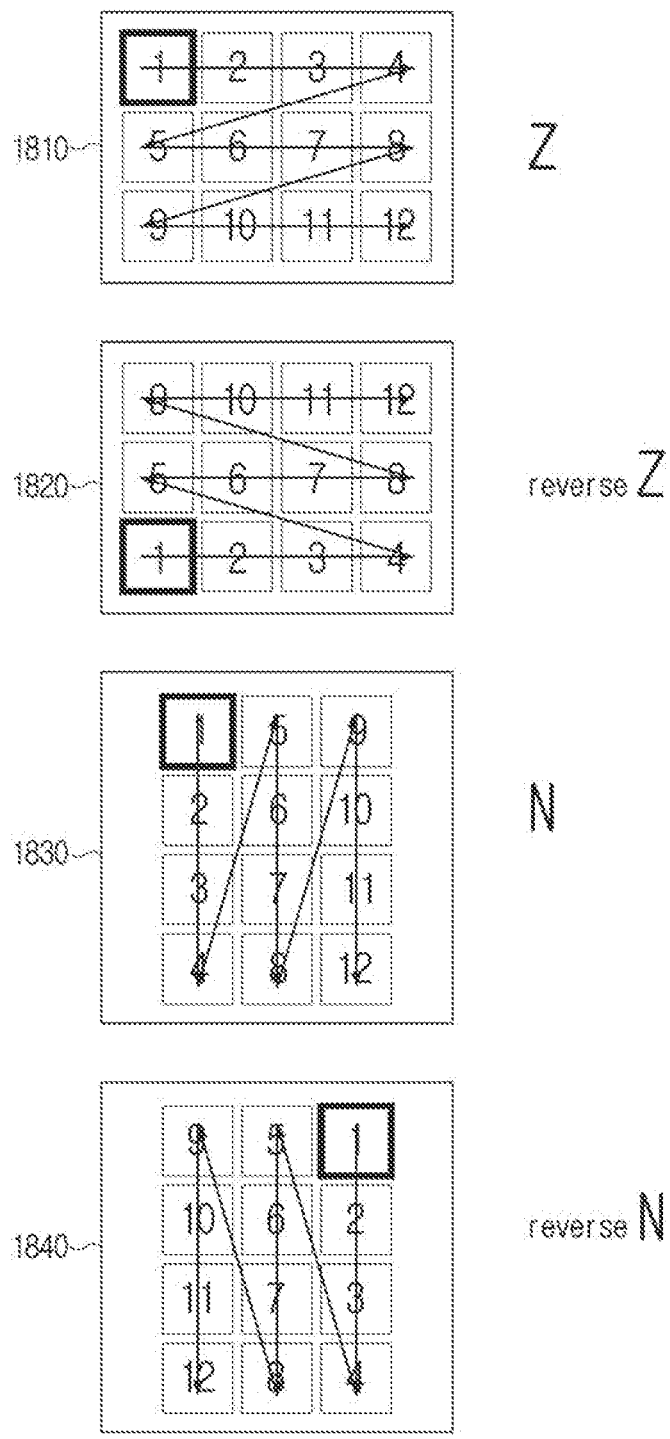
FIG. 18 is a diagram showing various examples of moving the focus GUI based on the priority information about the GUI item according to an embodiment of the disclosure.

For example, as shown in screens 1810, 1820, 1830, and 1840 of FIG. 18, the arrangement information may include information about a Z structure, an inverse Z structure, an N structure, and an inverse N structure. The arrangement structure may be identified based on the arrangement shape and arrangement sequence information.

The processor 120 may control the display 110 to move and display the focus GUI based on the priority information and the manipulation direction of the received wheel input in case that the arrangement information includes the priority information (or the arrangement sequence information) for each of the plurality of GUI items.

The arrangement sequence information may include an arrangement sequence corresponding to each of the plurality of GUI items. For example, in examples 301 and 302 of FIG. 3, a first GUI item 311 may be a first priority item, a second GUI item 312 may be a second priority item, a third GUI item 313 may be the third priority item, a fourth GUI item 314 may be a fourth priority item, and a fifth GUI item 315 may be a fifth priority item.

The processor 120 may move the focus GUI based on the arrangement sequence information. The processor 120 may sequentially move the focus GUI based on the arrangement sequence information when receiving the wheel input.

In an example, in case that the arrangement information includes the priority information, the processor 120 may ignore the operation of identifying the movement direction of the focus GUI as the horizontal direction and move the focus GUI based on the priority information.

In another example, in case that the arrangement information includes the priority information, the processor 120 may fix the movement direction of the focus GUI 10 to the horizontal direction. For example, as shown in the UI screen 1830 of FIG. 18, the arrangement sequence may be determined from item 1 to item 12. However, the electronic apparatus 100 may ignore the current priority information and move the focus GUI based on the identified movement direction (e.g., horizontal direction). Even though the priority of the GUI item is determined in the vertical direction, the processor 120 may move the focus GUI based on the horizontal direction. In case that the GUI items have the N structure as shown in the UI screen 1830, the processor 120 may move and display the focus GUI at the location corresponding to item #1, item #5, and item #9 in sequence based on the wheel input.

Various examples of using the priority information may be determined based on an application being currently executed.

The processor 120 may acquire identification information about an application providing the UI screen based on a predetermined event, and identify the movement direction of the focus GUI 10 as the horizontal direction based on the identification information about the application.

The UI screen displayed by the electronic apparatus 100 may be provided by the application. Accordingly, the processor 120 may determine the movement direction of the focus GUI 10 based on information about the application providing the UI screen.

The processor 120 may store, in the memory 140, the application information related to the movement direction (or predetermined movement direction) of the focus GUI 10 corresponding to each of at least one application. In addition, the processor 120 may identify the application currently being executed in the memory 140, and identify the movement direction of the focus GUI corresponding to the identified application based on the stored application information. In addition, the processor 120 may control the display 110 to move and display the focus GUI based on the manipulation direction of the received wheel input and the identified movement direction of the focus GUI.

In an application in which the GUI items are displayed in the horizontal direction, the movement direction of the focus GUI corresponding to the application may be determined as the horizontal direction. On the other hand, in an application in which the GUI items are displayed in the vertical direction, the movement direction of the focus GUI corresponding to the application may be determined as the vertical direction.

The processor 120 may control the display 110 to move and display the focus GUI upward or downward based on the manipulation direction of the wheel input in case that the identified possible movement direction of the focus GUI is the vertical direction, and control the display 110 to move and display the focus GUI on the left or right based on the manipulation direction of the wheel input in case that the identified possible movement direction of the focus GUI 10 is the horizontal direction.

An example in which the possible movement direction of the identified focus GUI is the vertical direction is described in example 302 of FIG. 3.

An example in which the possible movement direction of the identified focus GUI is the horizontal direction is described in example 301 of FIG. 3.

The processor 120 may control the display 110 not to move the focus GUI 10 based on the wheel input in case that a sub-UI including text mapped to a direction key is displayed on the UI screen.

The sub-UI may be a UI for providing mapping information about the direction key to the user. For example, a specific key (or specific text) may be mapped to at least one of an upward direction key, a downward direction key, a left direction key, and a right direction key. In case that the specific key (or specific text) is mapped to the direction key, the processor 120 may control the display 110 to display the sub-UI including information indicating which key is mapped to the direction key. The specific key may indicate at least one of a number, a letter, or a climate.

The processor 120 may ignore the wheel input based on receiving the wheel input of the user while the sub-UI is displayed to prevent input of the specific key mapped based on the wheel input. Based on receiving the wheel input of the user to change the screen or change the location of the focus GUI, the processor 120 may control the display 110 not to move the focus GUI based on the wheel input to prevent a situation in which the specific key mapped based on the wheel input is input.

Examples of displaying the sub-UI related to the mapping operation are described with reference to FIGS. 23 and 24.

The electronic apparatus 100 may fix the movement direction of the focus GUI moved based on the wheel input of the user to a specific direction when determining that the activated focus GUI is movable in various directions. The reason is that the user may be confused in the movement direction of the focus GUI in case that the wheel input is available in all directions of up, down, left, and right. The user may easily predict the display location of the focus GUI as a consistent movement direction of the focus GUI 10 case that the movement direction of the focus GUI is fixed to the predetermined direction.

The above description shows and describes only a simple configuration of the electronic apparatus 100, and various configurations may be further provided in its implementation. This case is described below with reference to FIG. 2.

Figure 2:
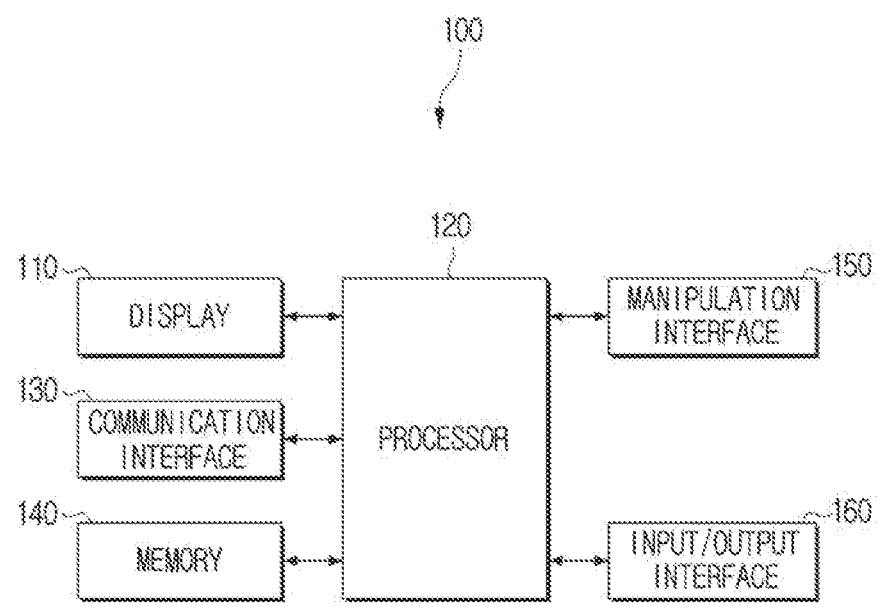
FIG. 2 is a block diagram showing a specific configuration of the electronic apparatus of FIG. 1 according to an embodiment of the disclosure.

FIG. 2 is a block diagram showing a specific configuration of the electronic apparatus of FIG. 1 according to an embodiment of the disclosure.

Referring to FIG. 2, the electronic apparatus 100 may include the display 110, the processor 120, a communication interface 130, the memory 140, a manipulation interface 150, and an input/output interface 160.

The description omits redundant descriptions of the same operations as those described above among the operations of the display 110 and the processor 120.

The communication interface 130 is a component that performs communication with various types of external devices by using various types of communication methods. The communication interface 130 may include a wireless communication module or a wired communication module. Each communication module may be implemented in the form of at least one hardware chip.

The wireless communication module may be a module that wirelessly communicates with the external device. For example, the wireless communication module may include at least one of a wireless-fidelity (Wi-Fi) module, a Bluetooth module, an infrared communication module, or other communication modules.

The Wi-Fi module and the Bluetooth module may respectively perform communications in a Wi-Fi manner and a Bluetooth manner. When using the Wi-Fi module or the Bluetooth module, the communication interface 130 may first transmit and receive various connection information such as a service set identifier (SSID) or a session key, connect the communication using this connection information, and then transmit and receive various information.

The infrared communication module may perform the communication based on infrared data association (IrDA) technology that wirelessly transmits data in a short distance by using an infrared ray between visible and millimeter waves.

In addition to the above-described communication manners, other communication modules may include at least one communication chip performing the communication based on various wireless communication standards such as Zigbee, third third generation (3G), 3rd generation partnership project (3GPP), long term evolution (LTE), LTE advanced (LTE-A), 4th generation (4G) and 5th generation (5G).

The wired communication module may be a module that communicates with the external device by wire. For example, the wired communication module may include at least one of a local area network (LAN) module, an Ethernet module, a pair cable, a coaxial cable, an optical fiber cable, or an ultra wide-band (UWB) module.

The memory 140 may be implemented as an internal memory such as a read-only memory (ROM, e.g., electrically erasable programmable read-only memory (EE-PROM)), a random access memory (RAM) or the like, which is included in the processor 120, or may be implemented as a memory separate from the processor 120. In this case, the memory 140 may be implemented in the form of a memory embedded in the electronic apparatus 100, or may be implemented in the form of a memory detachable from the electronic apparatus 100, based on a data storing purpose. For example, data for driving the electronic apparatus 100 may be stored in the memory embedded in the electronic apparatus 100, and data for an extension function of the electronic apparatus 100 may be stored in the memory detachable from the electronic apparatus 100.

The memory embedded in the electronic apparatus 100 may be implemented as at least one of a volatile memory (e.g., dynamic RAM (DRAM), static RAM (SRAM) or synchronous dynamic RAM (SDRAM)), a non-volatile memory (e.g., one time programmable ROM(OTPROM), programmable ROM (PROM), erasable and programmable ROM (EPROM), electrically erasable and programmable ROM (EEPROM)), a mask ROM, a flash ROM, a flash memory (e.g., NAND flash or NOR flash), a hard drive, or a solid state drive (SSD); and the memory detachable from the electronic apparatus 100 may be implemented as a memory card (e.g., compact flash (CF), secure digital (SD), micro secure digital (Micro-SD), mini secure digital (mini-SD), extreme digital (xD), or multi-media card (MMC)), an external memory (e.g., USB memory) which may be connected to a universal serial bus (USB) port, or the like.

The manipulation interface 150 may be implemented as a device such as a button, a touch pad, a mouse or a keyboard, or may be implemented as a touch screen which may also perform a manipulation input function in addition to the above-described display function. The button may be various types of buttons such as a mechanical button, a touch pad, or a wheel, which is positioned in any region of a body appearance of the electronic apparatus 100 such as its front surface, side surface or rear surface.

The input/output interface 160 may be any of a high definition multimedia interface (HDMI), a mobile high-definition link (MHL), a universal serial bus (USB), a display port (DP), a thunderbolt, a video graphics array (VGA) port, a red-green-blue (RGB) port, a D-subminiature (D-SUB), or a digital visual interface (DVI). The input/output interface 160 may input/output at least one of audio or video signals. In some examples, the input/output interface 160 may include a port for inputting and outputting only the audio signal and a port for inputting and outputting only the video signal as its separate ports, or may be implemented as a single port for inputting and outputting both the audio signal and the video signal. The electronic apparatus 100 may transmit at least one of the audio and video signals to the external device (for example, an external display device or an external speaker) through the input/output interface 160. In detail, an output port included in the input/output interface 160 may be connected to the external device, and the electronic apparatus 100 may transmit at least one of the audio and video signals to the external device through the output port.

The input/output interface 160 may be connected to the communication interface. The input/output interface 160 may transmit information received from the external device to the communication interface or transmit information received through the communication interface to the external device.

FIG. 3 is a diagram showing a plurality of GUI items arranged in a horizontal direction and a plurality of GUI items arranged in a vertical direction according to an embodiment of the disclosure.

In example 301 of FIG. 3, the electronic apparatus 100 may display the UI screen including the plurality of GUI items 311, 312, 313, 314, and 315 and the focus GUI 10. A UI screen 310 may be a screen on which the plurality of GUI items 311, 312, 313, 314, and 315 are arranged in the horizontal direction. The focus GUI 10 may be displayed at a location corresponding to the GUI item 311. The electronic apparatus 100 may move and display the focus GUI 10 in case that the wheel input is received from the user while the UI screen 310 is displayed. That is, based on receiving the wheel input, the electronic apparatus 100 may change the location of the focus GUI 10 and display the focus GUI 10 at the changed location.

For example, based on receiving the wheel input while the UI screen 310 is displayed, the electronic apparatus 100 may display the focus GUI 10 at a location corresponding to the GUI item 312. The wheel input may be the scroll input in the right direction or the scroll input in the downward direction.

In example 302 of FIG. 3, the electronic apparatus 100 may display a UI screen including a plurality of GUI items 331, 332, 333, 334, and 335 and the focus GUI 10. A UI screen 330 may be a screen on which the plurality of GUI items 331, 332, 333, 334, and 335 are arranged in the vertical direction. The focus GUI 10 may be displayed at a location corresponding to the GUI item 331. The electronic apparatus 100 may move and display the focus GUI 10 in case that the wheel input is received from the user while the UI screen 330 is displayed. That is, based on receiving the wheel input, the electronic apparatus 100 may change the location of the focus GUI 10 and display the focus GUI 10 at the changed location.

For example, based on receiving the wheel input while the UI screen 330 is displayed, the electronic apparatus 100 may display the focus GUI 10 at a location corresponding to the GUI item 334. The wheel input may be the scroll input in the right direction or the scroll input in the downward direction.

Figure 4:
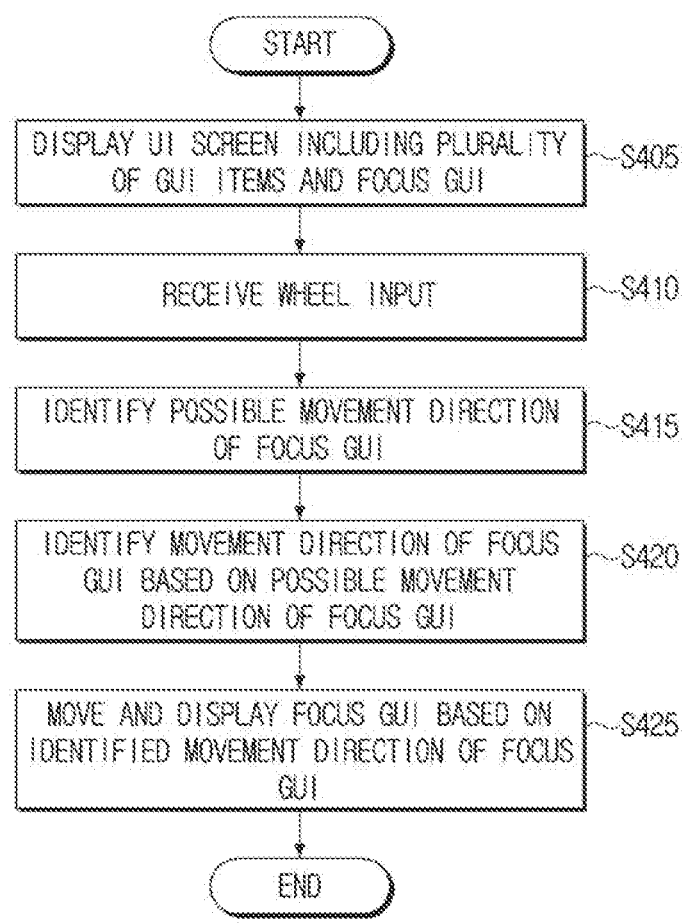
FIG. 4 is a flowchart showing an operation of moving a focus GUI based on a wheel input according to an embodiment of the disclosure.

FIG. 4 is a flowchart showing an operation of moving a focus GUI based on a wheel input according to an embodiment of the disclosure.

Referring to FIG. 4, in operation S405, the electronic apparatus 100 may display the UI screen including the plurality of GUI items and the focus GUI 10. In operation S410, the electronic apparatus 100 may then receive the wheel input of the user. In operation S415, the electronic apparatus 100 may then identify the possible movement direction of the focus GUI 10. The possible movement direction of the focus GUI may indicate a direction in which the currently displayed focus GUI 10 is movable in the current state. For example, the possible movement direction may include the upward direction, the downward direction, the left direction, the right direction, and the like. In addition, the possible movement direction may further include a diagonal direction (e.g., upper left direction, upper right direction, lower left direction, or lower right direction).

In operation S420, the electronic apparatus 100 may then identify the movement direction of the focus GUI 10 based on the possible movement direction of the focus GUI 10. The possible movement direction may indicate at least one direction in which the focus GUI 10 may be moved, and the movement direction may indicate one direction in which the focus GUI 10 may be actually moved.

In operation S425, the electronic apparatus 100 may then move and display the focus GUI 10 based on the identified movement direction of the focus GUI 10.

Figure 5:
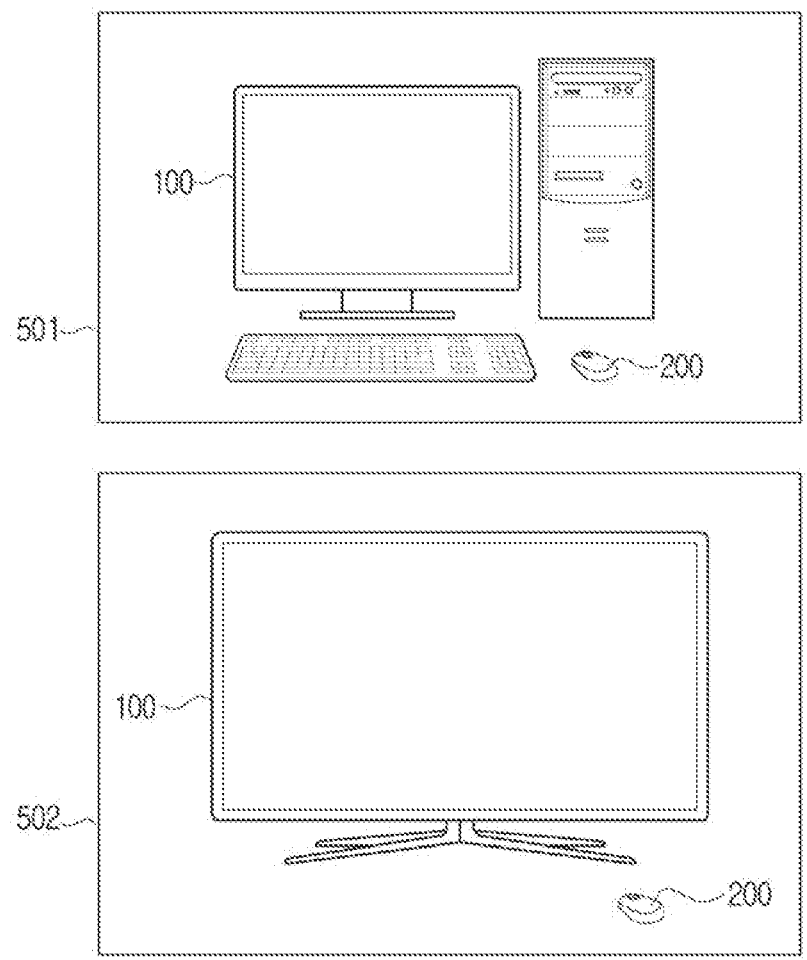
FIG. 5 is a diagram showing an operation in which an electronic apparatus receives the wheel input from an external input device according to an embodiment of the disclosure.

FIG. 5 is a diagram showing an operation in which an electronic apparatus receives the wheel input from an external input device according to an embodiment of the disclosure.

Referring to FIG. 5, the electronic apparatus 100 may include the display. The electronic apparatus 100 may display the UI screen through the display. The electronic apparatus 100 may receive the wheel input through the external input device 200. Based on receiving the wheel input, the external input device 200 may transmit a control signal for notifying that the wheel input is received to the electronic apparatus 100.

In example 501, the electronic apparatus 100 may be a computer monitor, and the external input device 200 may be a (wireless or wired) mouse.

In another example 502, the electronic apparatus 100 may be a television (TV), and the external input device 200 may be the (wireless or wired) mouse or a remote control.

Figure 6:
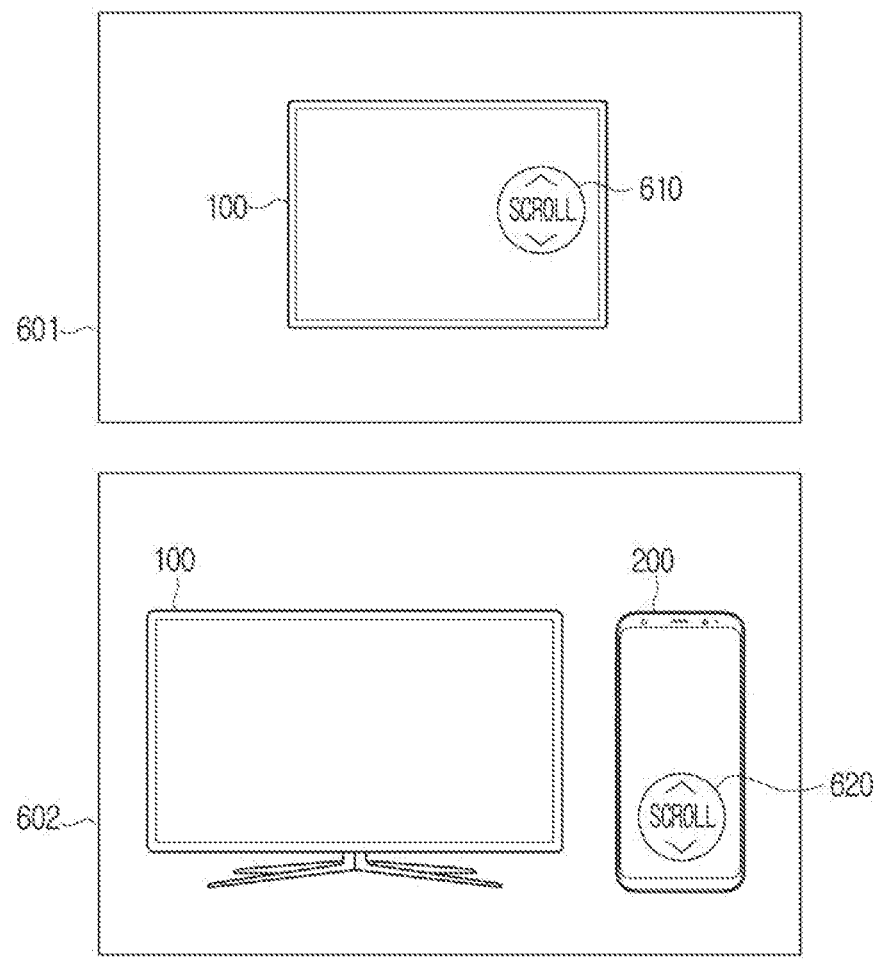
FIG. 6 is a diagram showing an operation in which the electronic apparatus directly receives the wheel input according to an embodiment of the disclosure.

FIG. 6 is a diagram showing an operation in which the electronic apparatus directly receives the wheel input according to an embodiment of the disclosure.

Referring to FIG. 6, the electronic apparatus 100 may include the display. The electronic apparatus 100 may display the UI screen through the display.

In example 601, the electronic apparatus 100 may be a display device displaying the UI screen. For example, the electronic apparatus 100 may be a tablet or a smartphone. The electronic apparatus 100 may display a scroll UT 610 for receiving the wheel input. The electronic apparatus 100 may identify that the wheel input is received in case that the scroll UT 610 is touched (or dragged) using a touch input method.

In another example 602, the electronic apparatus 100 may be the display device displaying the UI screen. The electronic apparatus 100 may receive the wheel input through the external input device 200. For example, the electronic apparatus 100 may be the TV, and the external input device 200 may be the tablet or the smartphone. The external input device 200 may display a scroll UT 620 for receiving the wheel input. The electronic apparatus 100 may identify that the wheel input is received in case that the scroll UI 620 is touched (or dragged) using the touch input method. In addition, the external input device 200 may transmit the control signal for notifying that the wheel input is received to the electronic apparatus 100.

Figure 7:
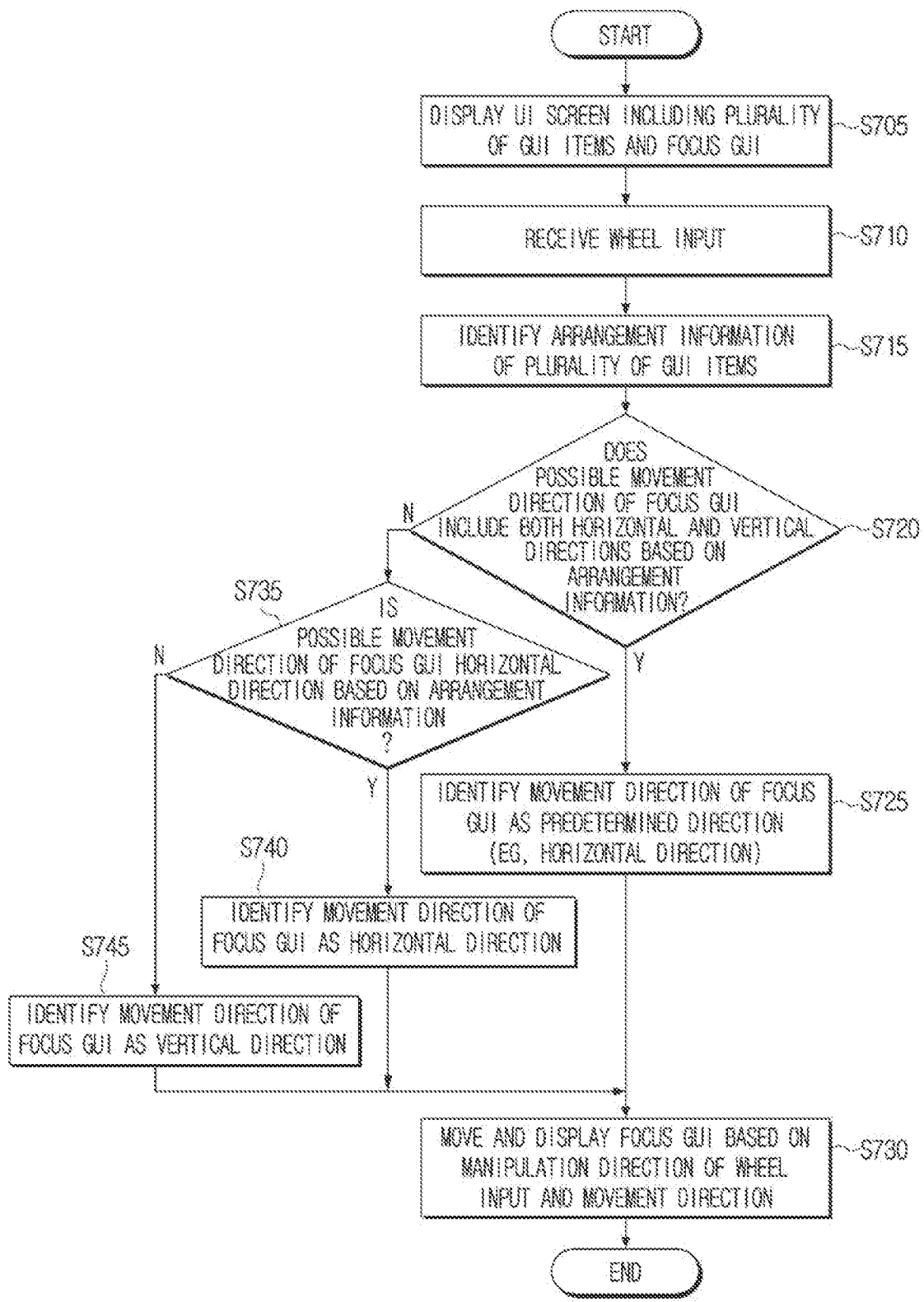
FIG. 7 is a flowchart showing an operation of moving the focus GUI in a predetermined direction based on the wheel input according to an embodiment of the disclosure.

FIG. 7 is a flowchart showing an operation of moving the focus GUI in a predetermined direction based on the wheel input according to an embodiment of the disclosure.

Referring to FIG. 7, in operation S705, the electronic apparatus 100 may display the UI screen including the plurality of GUI items and the focus GUI 10. In operation S710, the electronic apparatus 100 may then receive the wheel input of the user. In operation S715, the electronic apparatus 100 may then identify the arrangement information about the plurality of GUI items.

In operation S720, the electronic apparatus 100 may then identify whether the possible movement direction of the focus GUI 10 includes both the horizontal and vertical directions based on the arrangement information.

In case that the possible movement direction of the focus GUI 10 includes both the horizontal and vertical directions (S720-Y), the electronic apparatus 100 may identify the movement direction of the focus GUI 10 as the predetermined direction in operation S725. For example, the predetermined direction may be the horizontal direction. However, the predetermined direction may be changed to the vertical direction based on a user setting operation. In operation S730, the electronic apparatus 100 may then move and display the focus GUI 10 based on the manipulation direction of the wheel input and the movement direction of the identified focus GUI 10.

In case that the possible movement direction of the focus GUI 10 does not include both the horizontal and vertical directions (S720-N), in operation S735, the electronic apparatus 100 may identify the possible movement direction of the focus GUI 10 as the horizontal direction based on the arrangement information.

In case that the possible movement direction of the focus GUI 10 is the horizontal direction (S735-Y), in operation S740, the electronic apparatus 100 may identify the movement direction of the focus GUI 10 as the horizontal direction. The electronic apparatus 100 may then move and display the focus GUI 10 (in the horizontal direction) based on the manipulation direction of the wheel input and the movement direction of the focus GUI 10, in operation S730.

In case that the possible movement direction of the focus GUI 10 is not the horizontal direction (S735-N), in operation S745, the electronic apparatus 100 may identify the movement direction of the focus GUI 10 as the vertical direction. The electronic apparatus 100 may then move and display the focus GUI 10 (in the vertical direction) based on the manipulation direction of the wheel input and the movement direction of the focus GUI 10, in operation S730.

Figure 8:
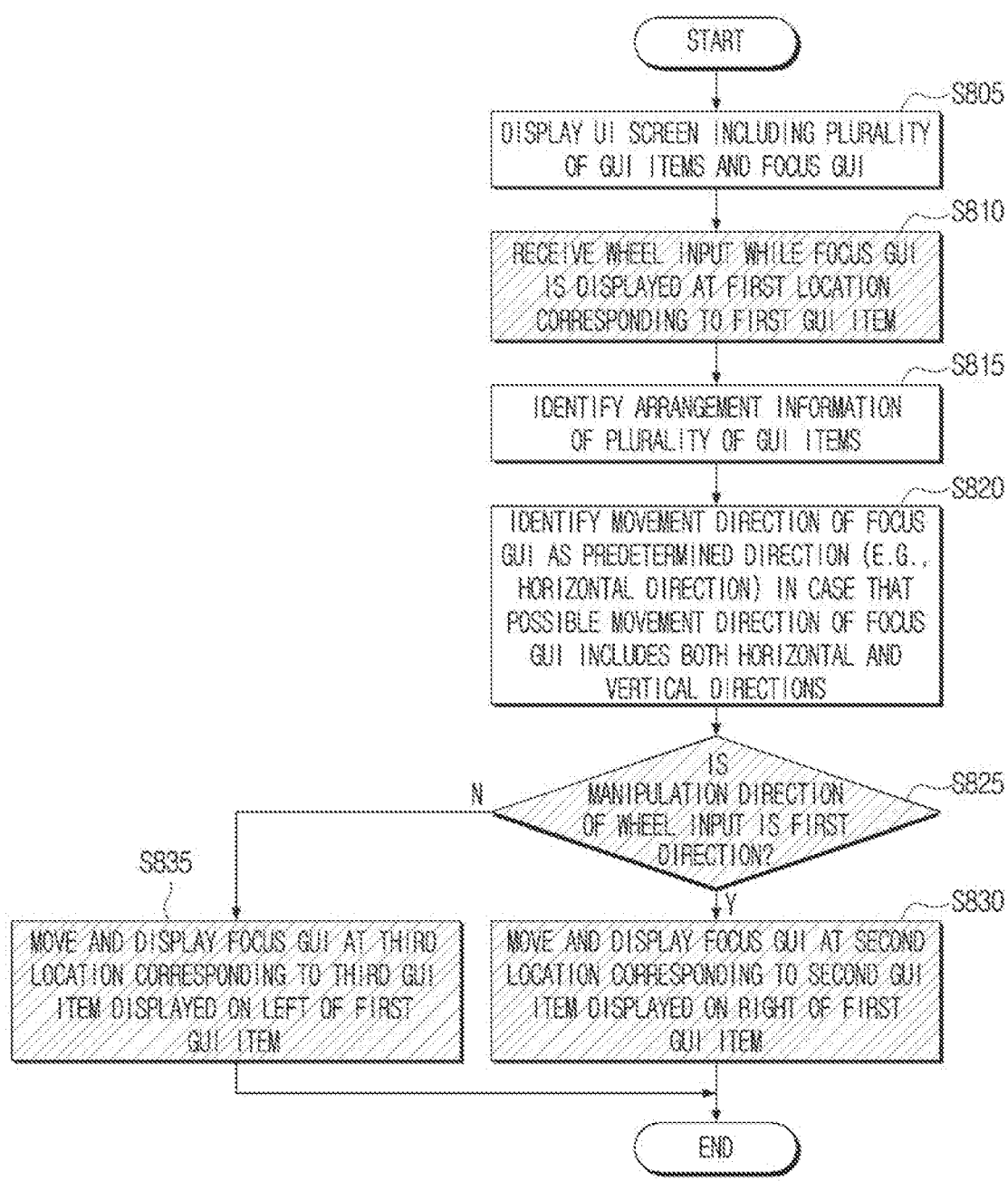
FIG. 8 is a flowchart showing an operation of moving the focus GUI based on a manipulation direction of the wheel input according to an embodiment of the disclosure.

FIG. 8 is a flowchart showing an operation of moving the focus GUI based on a manipulation direction of the wheel input according to an embodiment of the disclosure.

Referring to FIG. 8, in operation S805, the electronic apparatus 100 may display the UI screen including the plurality of GUI items and the focus GUI 10. In addition, the electronic apparatus 100 may display the focus GUI 10 at the first location corresponding to the first GUI item. In operation S810, the electronic apparatus 100 may receive the wheel input while the focus GUI 10 is displayed at the first location corresponding to the first GUI item. In operation S815, the electronic apparatus 100 may then identify the arrangement information about the plurality of GUI items.

In operation S820, the electronic apparatus 100 may then identify the movement direction of the focus GUI 10 as the predetermined direction in case that the possible movement direction of the focus GUI 10 includes both the horizontal and vertical directions. For example, the predetermined direction may be the horizontal direction. However, the predetermined direction may be changed to the vertical direction based on the user setting operation.

In operation S825, the electronic apparatus 100 may then identify whether the manipulation direction of the wheel input is the first direction. For example, the first direction may be the downward direction.

In case that the manipulation direction of the wheel input is the first direction (S825-Y), in operation S830, the electronic apparatus 100 may move and display the focus GUI 10 at the second location corresponding to the second GUI item displayed on the right of the first GUI item.

In case that the manipulation direction of the wheel input is not the first direction (S825-N), in operation S835, the electronic apparatus 100 may move and display the focus GUI 10 at the third location corresponding to the third GUI item displayed on the left of the first GUI item.

FIG. 9 is a diagram showing a possible movement direction of the focus GUI according to an embodiment of the disclosure.

In example 901 of FIG. 9, the electronic apparatus 100 may display a UI screen 910 including a plurality of GUI items (e.g., items 1 to 12) and the focus GUI 10. The focus GUI 10 may be displayed at a location corresponding to item #1.

In a state where the focus GUI 10 is displayed on item #1, the focus GUI 10 may be moved to a location corresponding to any one of the plurality of GUI items (items 2 to 12). It may be assumed that the focus GUI 10 is moved to the location corresponding to the nearest GUI item based on one wheel input.

The focus GUI 10 displayed on the UI screen 910 may be moved to a location corresponding to item #2 located at the right of item #1. The electronic apparatus 100 may display a UI screen 920 including the focus GUI 10 displayed at the location corresponding to item #2.

The focus GUI 10 displayed on the UI screen 910 may also be moved to a location corresponding to item #5 located below item #1. The electronic apparatus 100 may display a UI screen 930 including the focus GUI 10 displayed at the location corresponding to item #5.

As a result, the focus GUI 10 displayed on the UI screen 910 may be moved in the right direction or the downward direction, and the possible movement directions of the focus GUI 10 may thus include both the vertical and horizontal directions. In detail, the possible movement direction of the focus GUI 10 may be the right direction or the downward direction.

Figure 10:
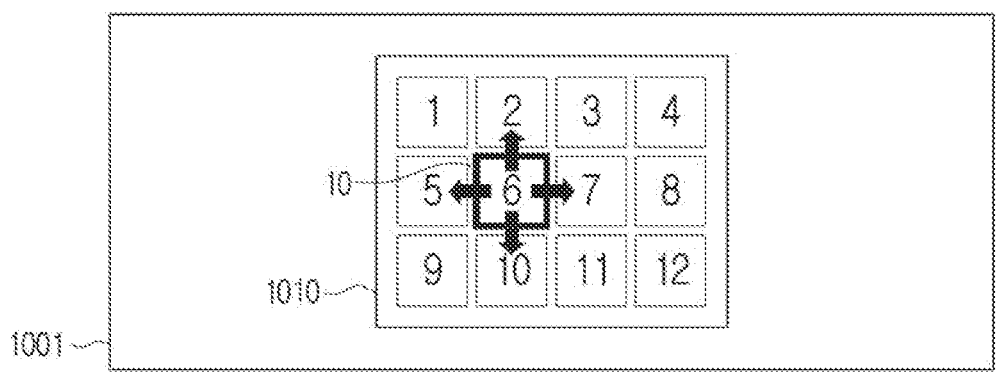
FIG. 10 is a diagram showing the possible movement direction of the focus GUI in various examples according to an embodiment of the disclosure.

FIG. 10 is a diagram showing the possible movement direction of the focus GUI in various examples according to an embodiment of the disclosure.

In example 1001 of FIG. 10, the electronic apparatus 100 may display a UI screen 1010 including a plurality of GUI items (e.g., items 1 to 12) and the focus GUI 10. The focus GUI 10 may be displayed at a location corresponding to item #6.

In a state where the focus GUI 10 is displayed on item #6, the focus GUI 10 may be moved to a location corresponding to any one of the plurality of GUI items (items 5 and 7 to 12). It may be assumed that the focus GUI 10 is moved to the location corresponding to the nearest GUI item based on one wheel input.

The focus GUI 10 displayed on the UI screen 1010 may be moved to a location corresponding to item #2 located above item #6.

The focus GUI 10 displayed on the UI screen 1010 may also be moved to a location corresponding to item #10 located below item #6.

The focus GUI 10 displayed on the UI screen 1010 may also be moved to a location corresponding to item #5 located on the left of item #6.

The focus GUI 10 displayed on the UI screen 1010 may also be moved to a location corresponding to item #7 located on the right of item #6.

As a result, the focus GUI 10 displayed on the UI screen 1010 may be moved in the upward direction, the downward direction, the left direction or the right direction, and the possible movement directions of the focus GUI 10 may thus include both the vertical and horizontal directions. In detail, the possible movement direction of the focus GUI 10 may be the upward direction, the downward direction, the left direction or the right direction.

In case that the possible movement direction of the focus GUI 10 includes both the vertical and horizontal directions, the electronic apparatus 100 may fix the movement direction of the focus GUI 10 corresponding to the wheel input to the horizontal direction. In detail, based on receiving the wheel input in the vertical direction rather than the wheel input in the horizontal direction, the electronic apparatus 100 may move and display the focus GUI 10 only in the horizontal direction.

Figure 11:
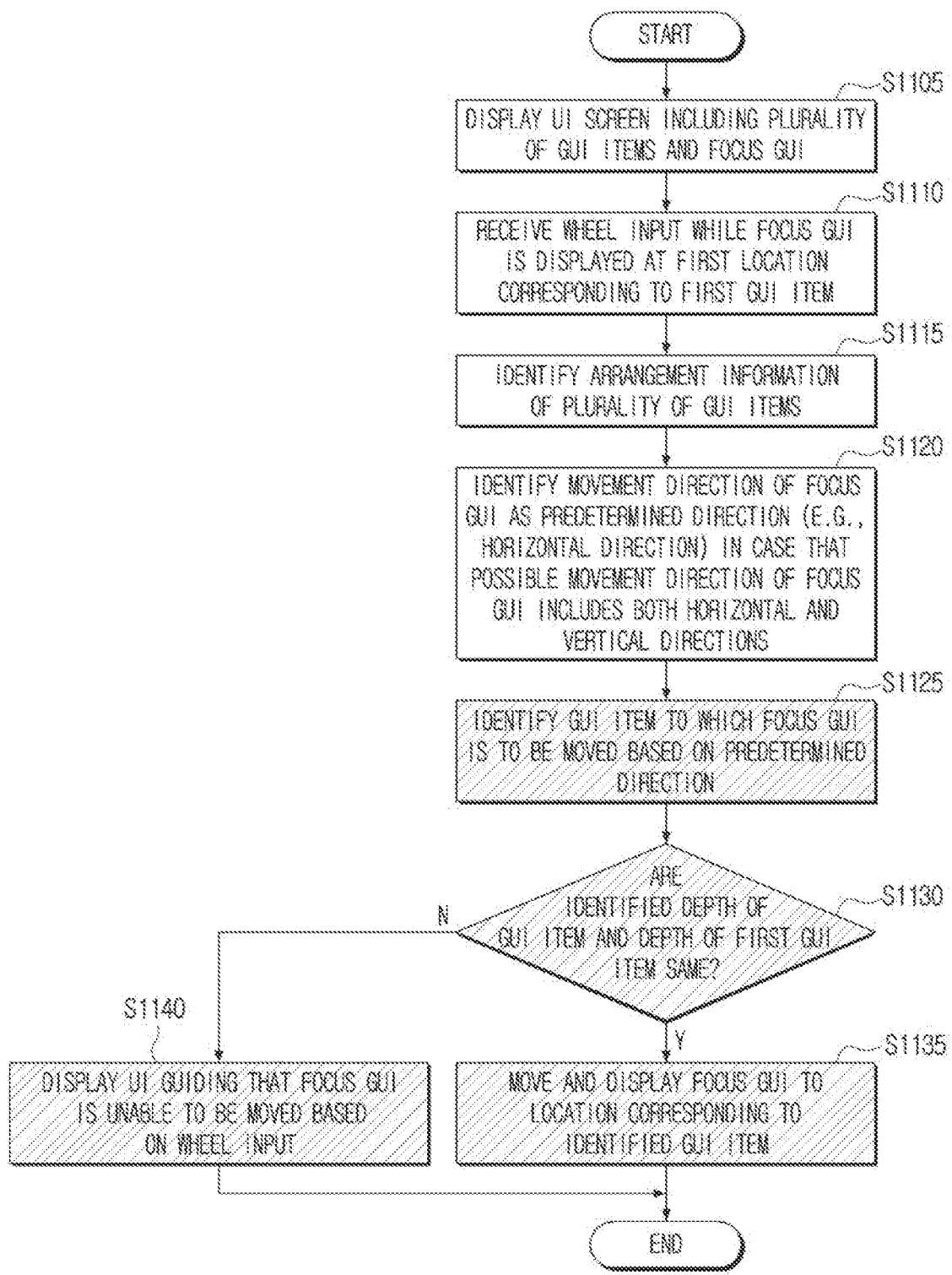
FIG. 11 is a flowchart showing an operation of moving the focus GUI by comparing depths of the GUI items according to an embodiment of the disclosure.

FIG. 11 is a flowchart showing an operation of moving the focus GUI by comparing depths of the GUI items according to an embodiment of the disclosure.

Operations S1105, S1110, S1115, and S1120 of FIG. 11 may each correspond to operations S805, S810, S815, and S820 of FIG. 8. Therefore, the description omits redundant descriptions thereof.

After operation S1120, the electronic apparatus 100 may then identify the GUI item to which the focus GUI 10 is to be moved based on the predetermined direction in operation S1125. In operation S1130, the electronic apparatus 100 may then identify whether the identified depth of the focus GUI 10 in operation S1125 and the depth of the first GUI item are the same as each other.

In case that the depth of the identified focus GUI 10 and the depth of the first GUI item are the same as each other (S1130-Y), the electronic apparatus 100 may move and display the focus GUI 10 to a location corresponding to the identified GUI item in operation S1135.

In case that the depth of the identified focus GUI 10 and the depth of the first GUI item are not the same as each other (S1130-N), the electronic apparatus 100 may display the UI guiding that the focus GUI 10 is unable to be moved based on the wheel input in operation S1140.

Figure 12:
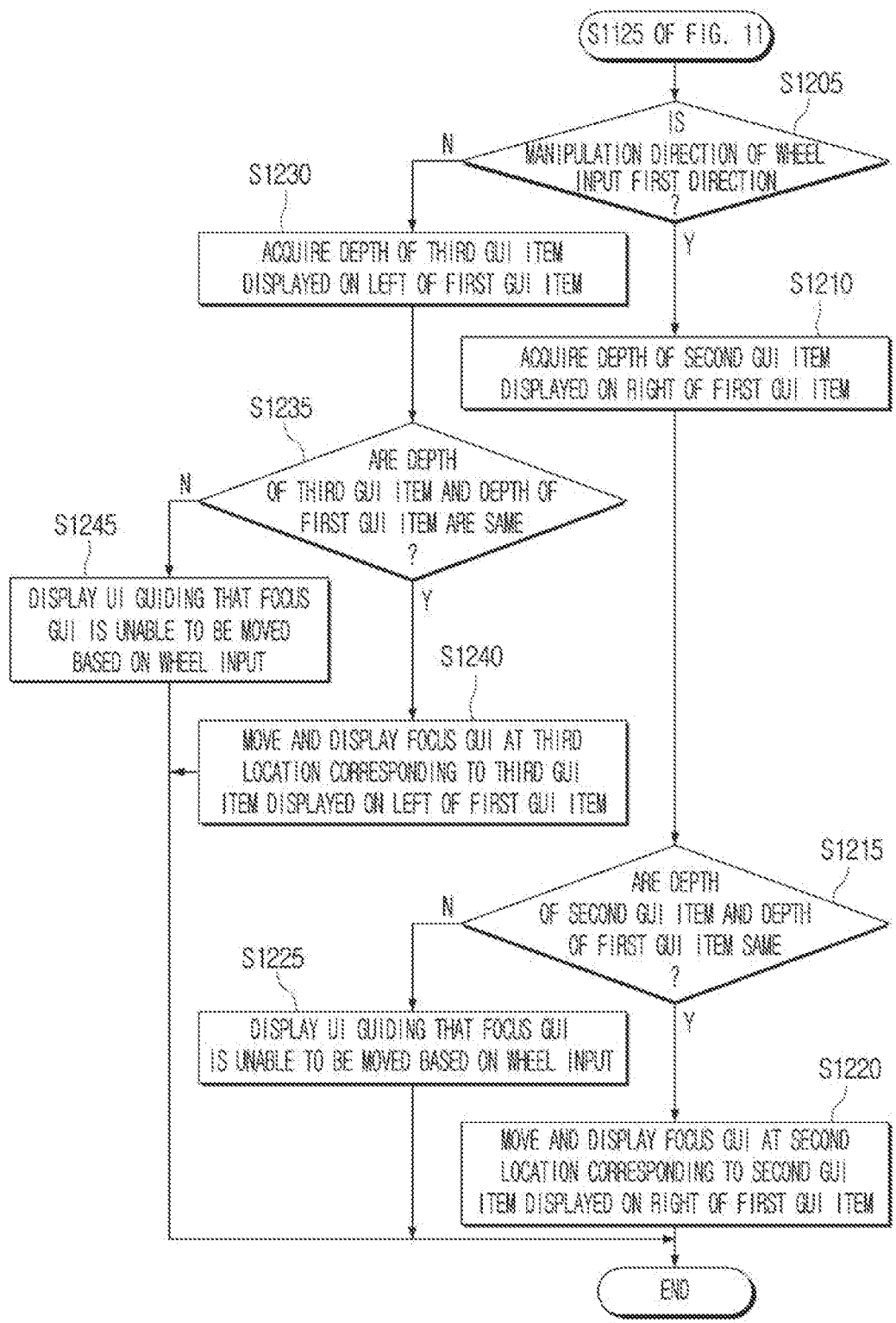
FIG. 12 is a flowchart showing the operation of FIG. 11 in detail according to an embodiment of the disclosure.

FIG. 12 is a flowchart showing the operation of FIG. 11 in detail according to an embodiment of the disclosure.

Referring to FIG. 12, after operation S1125 of FIG. 11, the electronic apparatus 100 may identify whether the manipulation direction of the wheel input is the first direction in operation S1205. For example, the first direction may be the scroll input in the downward direction.

In case that the manipulation direction of the wheel input is the first direction (S1205-Y), the electronic apparatus 100 may acquire the depth of the second GUI item displayed on the right of the first GUI item in operation S1210. The electronic apparatus 100 may then identify whether the depth of the second GUI item and the depth of the first GUI item are the same as each other in operation S1215.

In case that the depth of the second GUI item and the depth of the first GUI item are the same as each other (S1215-Y), the electronic apparatus 100 may move and display the focus GUI 10 at the second location corresponding to the second GUI item displayed on the right of the first GUI item in operation S1220.

In case that the depth of the second GUI item and the depth of the first GUI item are not the same as each other (S1215-N), the electronic apparatus 100 may display the UI guiding that the focus GUI 10 is unable to be moved based on the wheel input in operation S1225.

In case that the manipulation direction of the wheel input is not the first direction (S1205-N), the electronic apparatus 100 may identify that the manipulation direction of the wheel input is opposite to the first direction. The electronic apparatus 100 may then acquire the depth of the third GUI item displayed on the left of the first GUI item in operation S1230. The electronic apparatus 100 may then identify whether the depth of the third GUI item and the depth of the first GUI item are the same as each other in operation S1235.

In case that the depth of the third GUI item and the depth of the first GUI item are the same as each other (S1235-Y), the electronic apparatus 100 may move and display the focus GUI 10 at the third location corresponding to the third GUI item displayed on the left of the first GUI item in operation S1240.

In case that the depth of the third GUI item and the depth of the first GUI item are not the same as each other (S1235-N), the electronic apparatus 100 may display the UI indicating that the focus GUI 10 is unable to be moved based on the wheel input in operation S1245.

Figure 13:
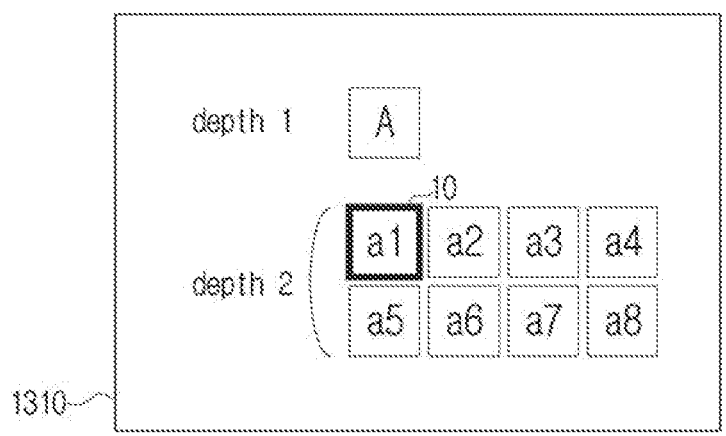
FIG. 13 is a diagram showing an operation of moving the focus GUI on the GUI items of different depths according to an embodiment of the disclosure.
Figure 13:
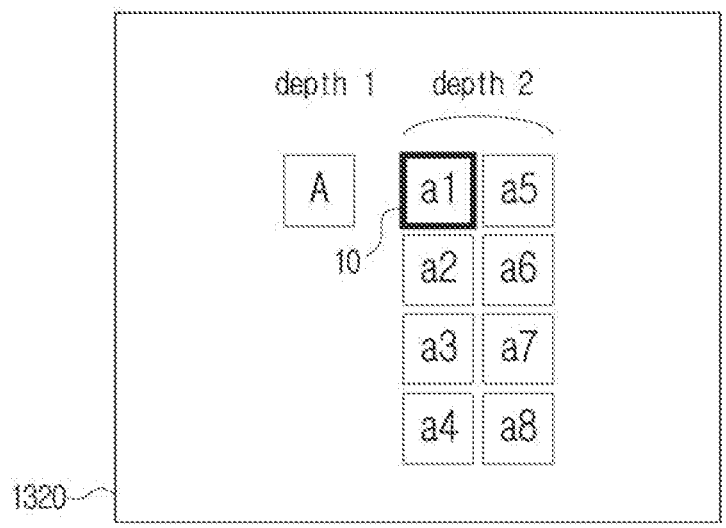

FIG. 13 is a diagram showing an operation of moving the focus GUI on the GUI items of different depths according to an embodiment of the disclosure.

Referring to FIG. 13, the electronic apparatus 100 may display a UI screen 1310 including a plurality of GUI items having different depths. The UI screen 1310 may include a GUI item (e.g., item "A") having a first depth (or depth 1). The UI screen 1310 may also include GUI items (e.g., items a1 to a8) each having a second depth (or depth 2).

The focus GUI 10 may be displayed at a location corresponding to item a1. Based on receiving the wheel input while the focus GUI 10 is displayed at the location corresponding to item a1, the electronic apparatus 100 may move the focus GUI 10 only to a location corresponding to the GUI item having the same depth as the depth (second depth) corresponding to item a1.

That is, the electronic apparatus 100 may control the currently displayed focus GUI 10 to be displayed only at the location corresponding to the GUI item having the same depth. For example, based on receiving the wheel input while the focus GUI 10 is displayed at the location corresponding to item a1, the electronic apparatus 100 may only display the focus GUI 10 on items a2 to a8, and be unable to display the focus GUI 10 on the location corresponding to the GUI item (e.g., item "A") having the first depth.

The UI screen 1310 may be a screen on which the GUI items of the second depth are arranged with priority in the horizontal direction. Unlike the UI screen 1310, a UI screen 1320 may be a screen on which GUI items are arranged with priority in the vertical direction. The description omits redundant descriptions related to the UI screen 1310.

Figure 14:
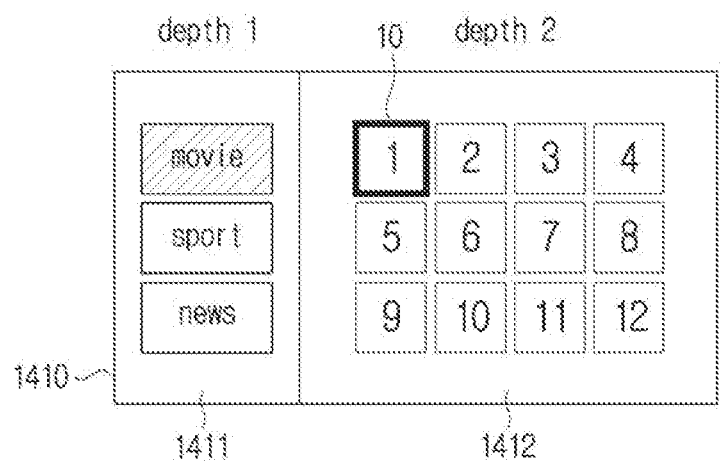
FIG. 14 is a diagram showing an operation of moving the focus GUI on the GUI items of different depths in various examples according to an embodiment of the disclosure.
Figure 14:
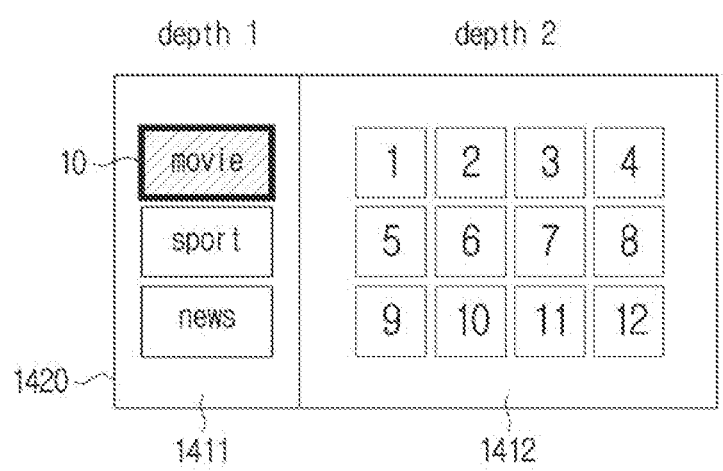

FIG. 14 is a diagram showing an operation of moving the focus GUI on the GUI items of different depths in various examples according to an embodiment of the disclosure.

Referring to FIG. 14, the electronic apparatus 100 may display a UI screen 1410 including a plurality of GUI items having different depths. The UI screen 1410 may include GUI items (e.g., movie item, sport item, and news item) each having the first depth (e.g., depth 1). The UI screen 1410 may also include GUI items (e.g., items 1 to 12) each having the second depth (or depth 2).

The focus GUI 10 may be displayed at the location corresponding to item #1. Based on receiving the wheel input while the focus GUI 10 is displayed at the location corresponding to item #1, the electronic apparatus 100 may move the focus GUI 10 only to a location corresponding to the GUI item having the same depth as the depth (second depth) corresponding to item #1.

That is, the electronic apparatus 100 may control the currently displayed focus GUI 10 to be displayed only at the location corresponding to the GUI item having the same depth. For example, based on receiving the wheel input while the focus GUI 10 is displayed at the location corresponding to item #1, the electronic apparatus 100 may only display the focus GUI 10 on items 2 to 12, and may be unable to display the focus GUI 10 on the location corresponding to the GUI item (e.g., movie item, sport item, or news item) having the first depth.

Based on identifying the predetermined event while the focus GUI 10 is displayed at the location corresponding to item #1, the electronic apparatus 100 may move the focus GUI 10 to a location corresponding to the GUI item (e.g., movie item, sport item, or news item) having a different depth from item #1 corresponding to the location where the focus GUI 10 is displayed. The predetermined event may be an event where an acceleration of the wheel input is a threshold value or more. For example, in case that a scroll acceleration of the wheel input of the user is the threshold value or more, the electronic apparatus 100 may display the focus GUI 10 at the location corresponding to the GUI item (e.g., movie item) having the first depth different from the second depth of item #1. Accordingly, the electronic apparatus 100 may display a screen 1420 on which the focus GUI 10 is displayed at the location corresponding to the movie item.

Figure 15:
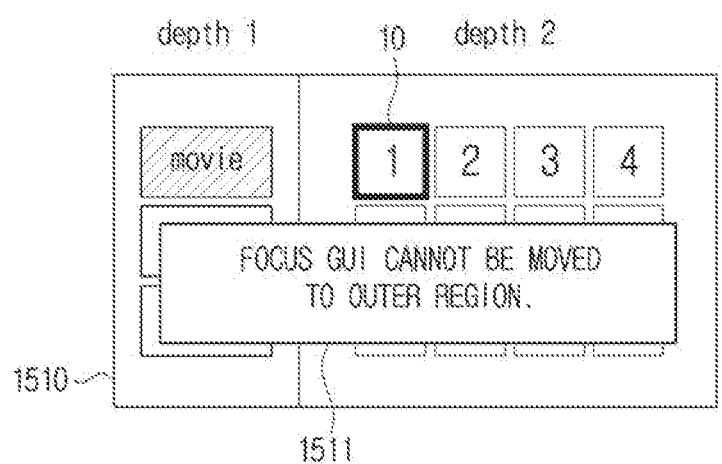
FIG. 15 is a diagram showing a guide UI displayed when the focus GUI is moved to the GUI item of a different depth according to an embodiment of the disclosure.

FIG. 15 is a diagram showing a guide UI displayed when the focus GUI is moved to the GUI item of a different depth according to an embodiment of the disclosure.

Referring to FIG. 15, in case that the depth of the GUI item to which the focus GUI 10 is to be moved is different from the depth of the currently displayed GUI item, the electronic apparatus 100 may display a screen 1510 including a UI 1511 for guiding that the focus GUI 10 is unable to be moved.

The current focus GUI 10 may be displayed at a location corresponding to the GUI item (e.g., item #1) having the second depth. Based on receiving the wheel input having the manipulation direction of the left direction (or upward direction), the electronic apparatus 100 may determine not to display the focus GUI 10 at the location corresponding to the GUI item (e.g., movie item) of the first depth different from the second depth. The reason is to prevent the focus GUI 10 from being moved to a different depth. The electronic apparatus 100 may provide a guide UI for notifying the user of such a limited operation.

Figure 16:
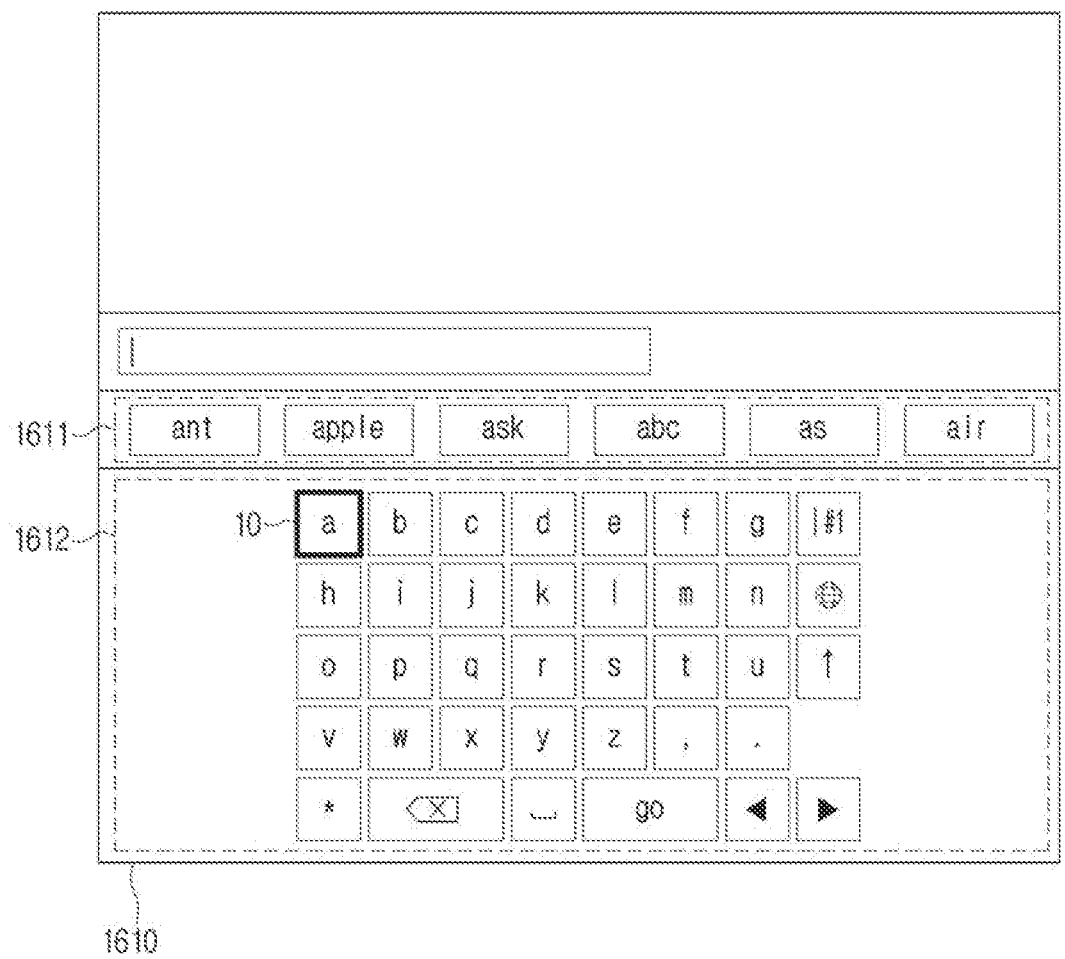
FIG. 16 is a diagram showing an operation of moving the focus GUI in the GUI item of a different depth in various examples according to an embodiment of the disclosure.

FIG. 16 is a diagram showing an operation of moving the focus GUI in the GUI item of a different depth in various examples according to an embodiment of the disclosure.

Referring to FIG. 16, the electronic apparatus 100 may display a UI screen 1610 including a plurality of regions. The UI screen 1610 may include a first region 1611 and a second region 1612. The first region 1611 and the second region 1612 may be distinguished based on a predetermined screen configuration. The predetermined screen configuration may be included in screen information including screen configuration information. The electronic apparatus 100 may identify that the GUI items are arranged in different regions based on the screen information.

The first region 1611 may be a region for displaying a sample item related to the GUI item corresponding to the location where the focus GUI 10 is displayed. For example, the first region may be a region for displaying an automatic completion word related to the GUI item corresponding to the location where the focus GUI 10 is displayed.

The second region 1612 may be a region for inputting text information. For example, the second region 1612 may be a region for inputting a letter, a number, a symbol, and the like.

In case that the focus GUI 10 is displayed on item "a" in the second region 1612, the electronic apparatus 100 may display a sample item (e.g., item "ant," item "apple," item "ask," item "abc," item "as," or item "air") related to item "a" in the first region 1611.

The electronic apparatus 100 may not display the focus GUI 10 at the location corresponding to the GUI item included in the first region 1611 even when receiving the wheel input for the focus GUI 10 displayed on item "a."

Figure 17:
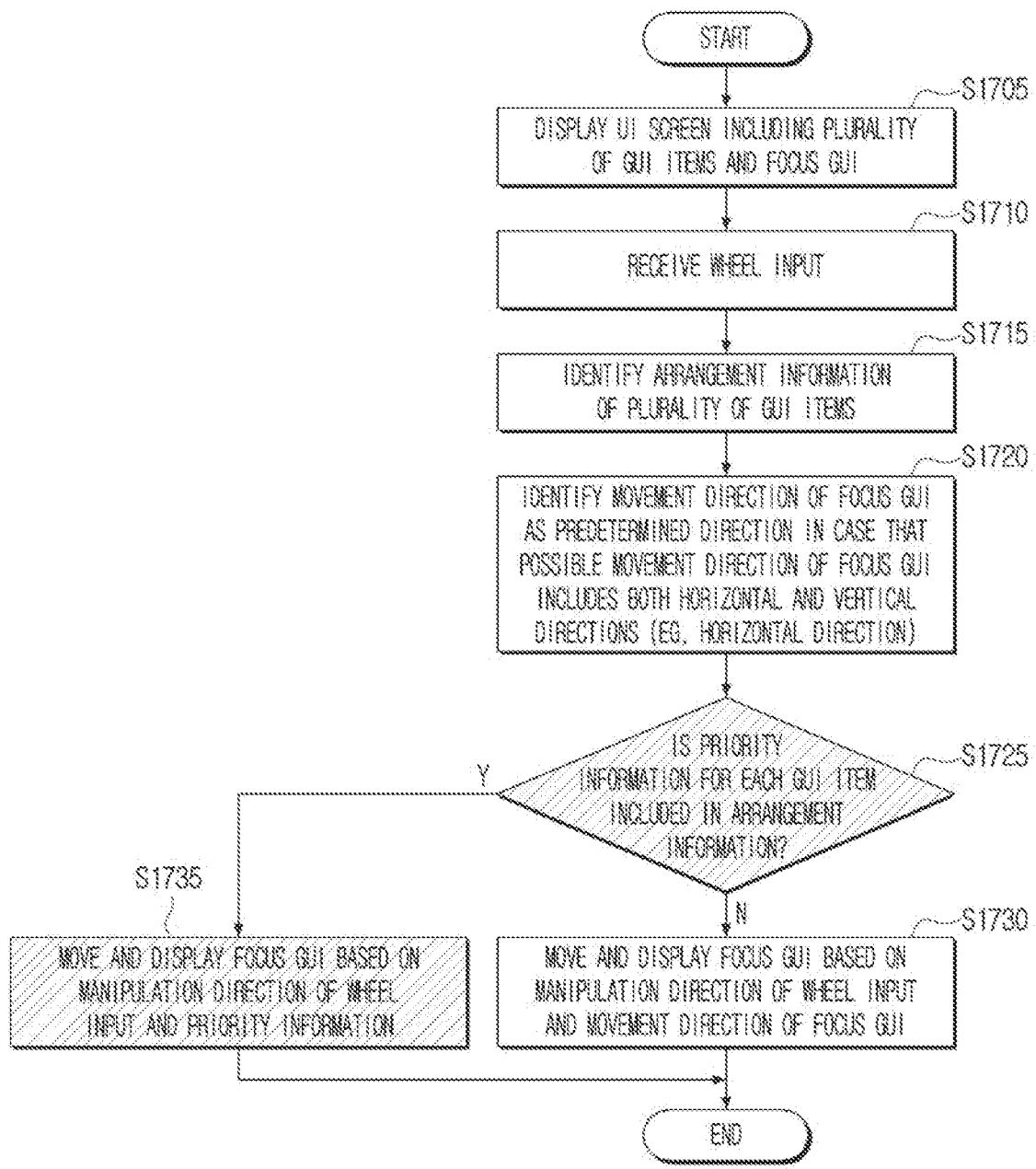
FIG. 17 is a flowchart showing an operation of moving the focus GUI based on priority information about the GUI item according to an embodiment of the disclosure.

FIG. 17 is a flowchart showing an operation of moving the focus GUI based on priority information about the GUI item according to an embodiment of the disclosure.

Referring to FIG. 17, the electronic apparatus 100 may display the UT screen including the plurality of GUI items and the focus GUI 10 in operation S1705. The electronic apparatus 100 may receive the wheel input while displaying the UT screen in operation S1710. The electronic apparatus 100 may then identify the arrangement information about the plurality of GUI items in operation S1715. The electronic apparatus 100 may then identify the movement direction of the focus GUI 10 as the predetermined direction in case that the possible movement direction of the focus GUI 10 includes both the horizontal and vertical directions in operation S1720. For example, the predetermined direction may be the horizontal direction. However, the predetermined direction may be changed to the vertical direction based on the user setting operation.

The electronic apparatus 100 may identify whether the priority information for each GUI item is included in the arrangement information in operation S1725.

In case that the priority information for each GUI item is not included in the arrangement information (S1725-N), the electronic apparatus 100 may move and display the focus GUI 10 based on the manipulation direction of the wheel input and the movement direction of the focus GUI 10 in operation S1730.

In case that the priority information for each GUI item is included in the arrangement information (S1725-Y), the electronic apparatus 100 may move and display the focus GUI 10 based on the manipulation direction of the wheel input and the priority information in operation S1735.

FIG. 18 is a diagram showing various examples of moving the focus GUI based on the priority information about the GUI item according to an embodiment of the disclosure.

A screen 1810 of FIG. 18 shows priorities in the Z structure. The arrangement information may include the priority information in which the GUI items are arranged by giving priority to the horizontal direction (or the left-right direction). Items 1 to 4 may be arranged from left to right in the horizontal direction, and then the remaining GUI items may be arranged from top to bottom in the vertical direction.

A screen 1820 of FIG. 18 shows priorities in the inverse Z structure. The arrangement information may include the priority information in which the GUI items are arranged by giving priority to the horizontal direction (or the left-right direction). Items 1 to 4 may be arranged from left to right in the horizontal direction, and then the remaining GUI items may be arranged from bottom to top in the vertical direction.

A screen 1830 of FIG. 18 shows priorities in the N structure. The arrangement information may include the priority information in which the GUI items are arranged by giving priority to the vertical direction (or the up-down direction). Items 1 to 4 may be arranged from top to bottom in the vertical direction, and then the remaining GUI items may be arranged from left to right in the horizontal direction.

A screen 1840 of FIG. 18 shows priorities in the inverse N structure. The arrangement information may include the priority information in which the GUI items are arranged by giving priority to the vertical direction (or the up-down direction). Items 1 to 4 may be arranged from top to bottom in the vertical direction, and then the remaining GUI items may be arranged from right to left in the horizontal direction.

The focus GUI 10 may also be moved based on the priority of the GUI items. The electronic apparatus 100 may first display the focus GUI 10 on item #2, and then on items 3 to 12 in sequence when continuously receiving the wheel inputs while the focus GUI 10 is displayed at the location corresponding to item #1.

In another example, the possible movement direction of the focus GUI 10 may include the horizontal direction and the vertical direction even though the priority information is determined. In this case, the electronic apparatus 100 may ignore the priority information and determine the movement direction of the focus GUI 10 as the predetermined direction (e.g., horizontal direction). The reason is to consistently provide the user with a rule that the wheel input is moved in the horizontal direction regardless of the priority.

Figure 19:
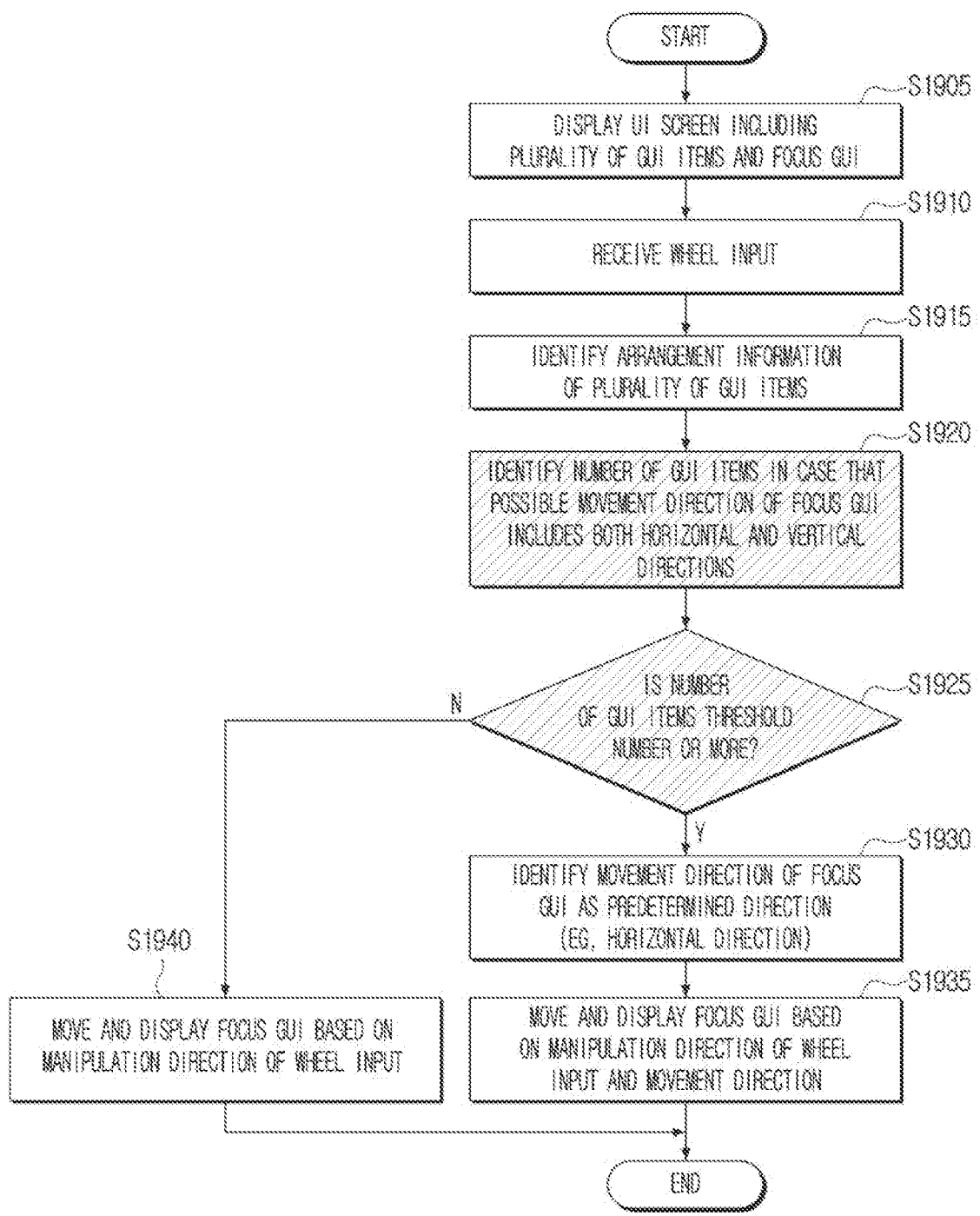
FIG. 19 is a flowchart showing an operation of moving the focus GUI in the predetermined direction based on the number of the plurality of GUI items according to an embodiment of the disclosure.

FIG. 19 is a flowchart showing an operation of moving the focus GUI in the predetermined direction based on the number of the plurality of GUI items according to an embodiment of the disclosure.

Referring to FIG. 19, operations S1905, S1910, and S1915 may each correspond to operations S1705, S1710, and S1715 of FIG. 17, and the description thus omits redundant descriptions thereof.

In addition, the electronic apparatus 100 may identify the number of GUI items included in the screen in case that the possible movement direction of the focus GUI 10 includes both the horizontal and vertical directions in operation S1920. The electronic apparatus 100 may identify the number of GUI items based on the arrangement information. The electronic apparatus 100 may then identify whether the number of GUI items included in the screen is a threshold number or more in operation S1925.

In case that the number of GUI items is the threshold number or more (S1925-Y), the electronic apparatus 100 may identify the movement direction of the focus GUI 10 as the predetermined direction in operation S1930. For example, the predetermined direction may be the horizontal direction. However, the predetermined direction may be changed to the vertical direction based on the user setting operation. The electronic apparatus 100 may then move and display the focus GUI 10 based on the manipulation direction of the wheel input and the movement direction of the identified focus GUI 10 in operation S1935.

In case that the number of GUI items is less than the threshold number (S1925-N), the electronic apparatus 100 may move and display the focus GUI 10 based on the manipulation direction of the wheel input in operation S1940. For example, in case that the manipulation direction of the wheel input is the upward direction or the downward direction, the electronic apparatus 100 may move the focus GUI 10 in the upward direction or the downward direction. In addition, in case that the manipulation direction of the wheel input is the left direction or the right direction, the electronic apparatus 100 may move the focus GUI 10 in the left direction or the right direction.

Figure 20:
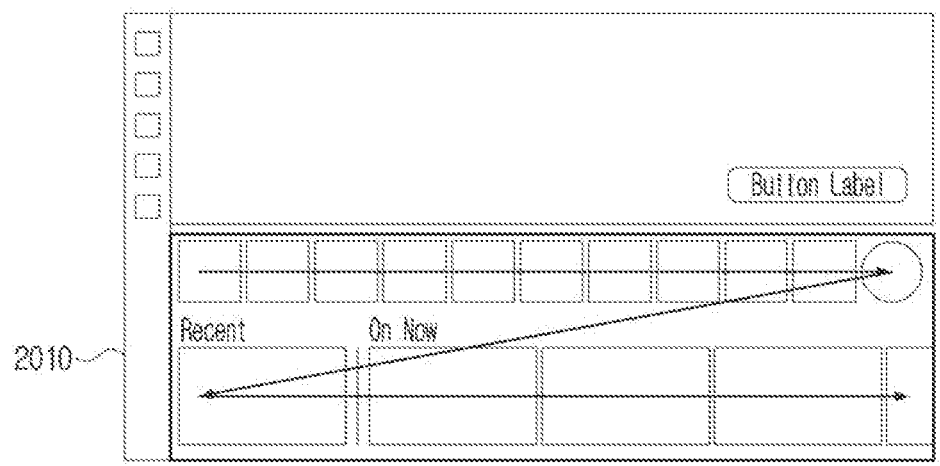
FIG. 20 is a diagram showing an operation of moving the focus GUI in various examples according to an embodiment of the disclosure.
Figure 20:
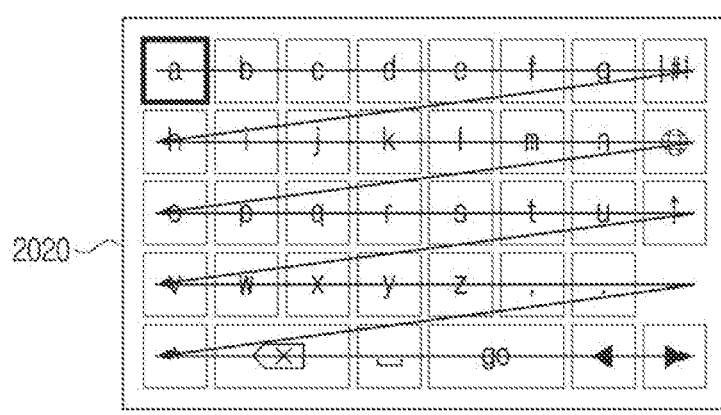

FIG. 20 is a diagram showing an operation of moving the focus GUI in various examples according to an embodiment of the disclosure.

Referring to FIG. 20, the electronic apparatus 100 may display UI screens 2010 and 2020 including a plurality of GUI items. The electronic apparatus 100 may identify the number of GUI items included in the screen. In addition, the movement direction of the focus GUI 10 may be determined as the horizontal direction in case that the number of GUI items is greater than or equal to a threshold number of GUI items.

It may be assumed that the threshold number is 10 and the number of GUI items included in the screens 2010 and 2020 is 10 or more. The electronic apparatus 100 may identify the movement direction of the focus GUI 10 as the horizontal direction as the number of GUI items is the threshold number or more. In addition, the electronic apparatus 100 may move the focus GUI 10 in the horizontal direction although receiving the wheel input in the downward direction.

Unlike the screens 2010 and 2020, it may be assumed that the number of GUI items is less than the threshold number. Based on receiving the wheel input in the downward direction, the electronic apparatus 100 may move the focus GUI 10 in the downward direction.

Figure 21:
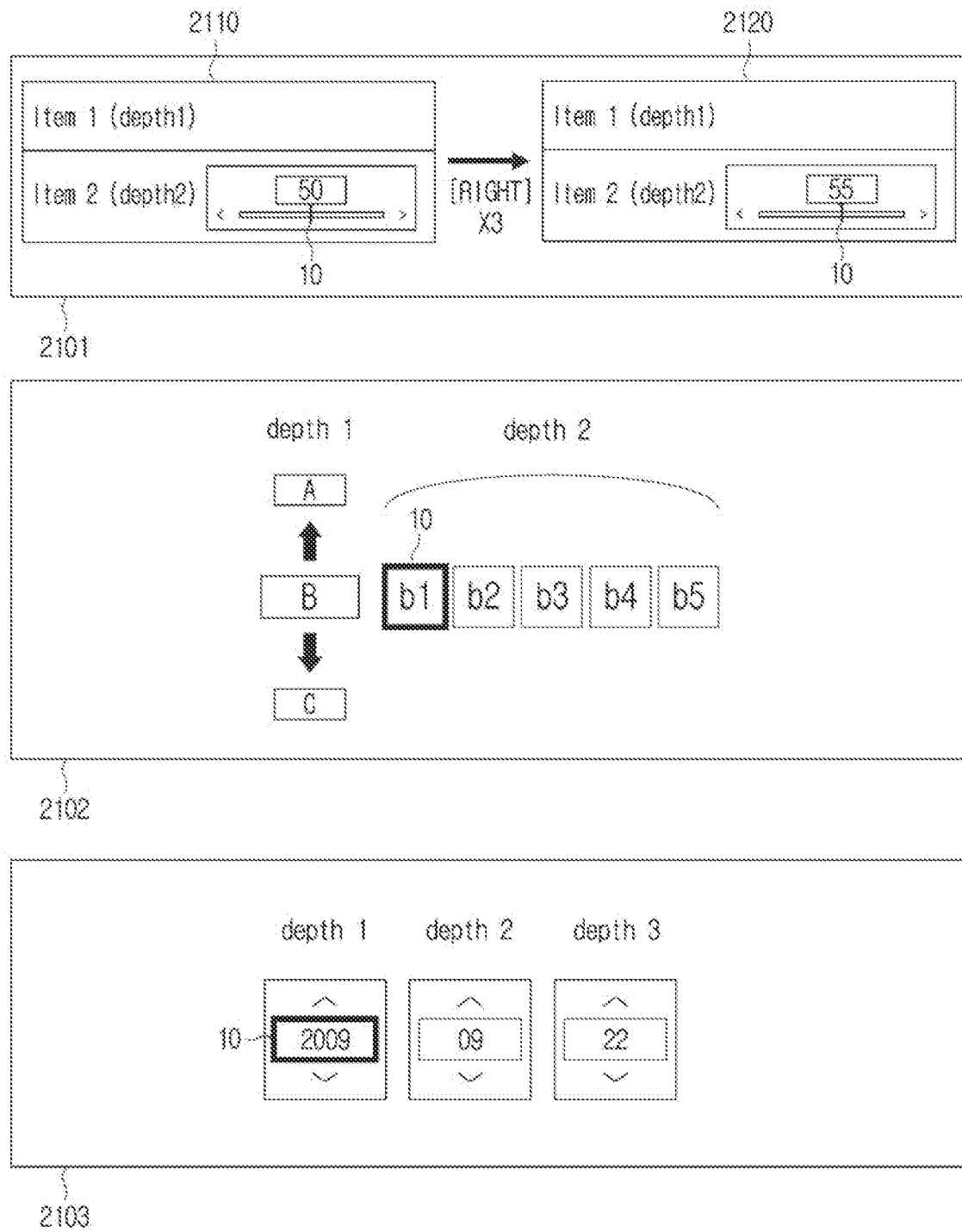
FIG. 21 is a diagram showing an operation of moving the focus GUI in a situation where the GUI item of a different depth exists in various examples according to an embodiment of the disclosure.

FIG. 21 is a diagram showing an operation of moving the focus GUI in a situation where the GUI item of a different depth exists in various examples according to an embodiment of the disclosure.

Referring to example 2101 of FIG. 21, the electronic apparatus 100 may display a UI screen 2110 including GUI items (e.g., items 1 and 2) of the first depth, the GUI item (or set value) of the second depth, and the focus GUI 10. The GUI item of the second depth may indicate a set value of the currently selected GUI item (or item #2) among the GUI items of the first depth. The focus GUI 10 may be displayed at a location corresponding to the set value of the GUI item of the second depth. For example, the focus GUI 10 may indicate a set value of 50. Based on receiving the wheel input (e.g., input for the movement to the right for five times) while the focus GUI 10 indicates the set value of 50, the electronic apparatus 100 may move and display the focus GUI 10 to indicate a changed set value (of 55 for example) based on the wheel input.

Referring to example 2102 of FIG. 21, the electronic apparatus 100 may display a UI screen including GUI items (e.g., item "A," item "B," and item "C") of the first depth, GUI items (e.g., items b1 to b5) of the second depth, and the focus GUI 10. The GUI items of the second depth may indicate a lower item of the currently selected GUI item (e.g., item "B") among the GUI items of the first depth. The focus GUI 10 may be displayed at a location corresponding to the currently selected GUI item (e.g., item b1) of the second depth.

Referring to example 2103 of FIG. 21, the electronic apparatus 100 may display a UI screen including a GUI item (year item) of the first depth, a GUI item (month item) of the second depth, a GUI item (day item) of the third depth, and the focus GUI 10. The focus GUI 10 may be displayed at a location corresponding to the currently selected GUI item (e.g., year item) of the first depth.

FIG. 22 is a diagram showing an operation of moving the focus GUI in a situation where the GUI item of a different depth exists in various examples according to an embodiment of the disclosure.

Referring to FIG. 22, the electronic apparatus 100 may display a UI screen 2210 including a first region 2211 and a second region 2212. The first region 2211 may include at least one of text information or image information requiring scrolling. For example, in case that the user cannot be provided with all information through the currently displayed screen, a portion capable of being provided to the user may be controlled through the scrolling. The second region 2212 may include a GUI item (e.g., next item or previous item) for receiving a user command to display information different from that displayed in the first region 2211.

Up and down scroll operations may be performed in the first region 2211, and left and right scroll operations may be performed in the second region 2212.

In general, based on receiving the wheel input in the vertical direction in a situation where the UI screen 2210 is displayed, the electronic apparatus 100 may perform an operation corresponding to the wheel input in a currently activated region. For example, based on receiving the wheel input in the vertical direction while the first region 2211 is activated, the electronic apparatus 100 may change information displayed in the first region 2211.

However, based on identifying the horizontal direction as the possible movement direction of the focus GUI 10, the electronic apparatus 100 may move and display the focus GUI 10 in the horizontal direction regardless of the currently activated region. For example, based on receiving the wheel input in the vertical direction while the first region 2211 is activated, the electronic apparatus 100 may move and display the focus GUI 10 at a location corresponding to the GUI item displayed in the second region 2212 without changing the information displayed in the first region 2211.

Figure 23:
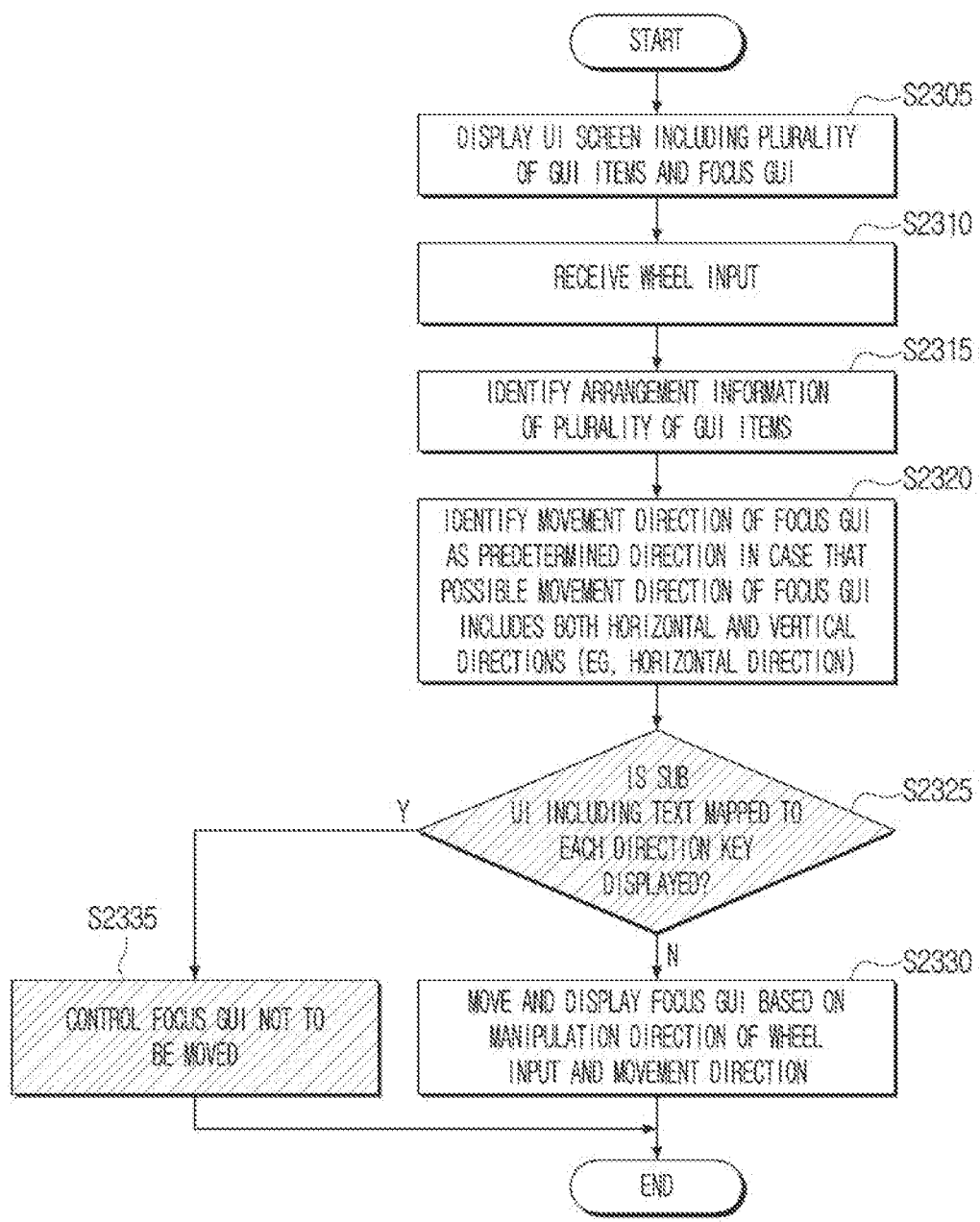
FIG. 23 is a flowchart showing an operation of controlling the focus GUI when text is mapped to a direction key according to an embodiment of the disclosure.

FIG. 23 is a flowchart showing an operation of controlling the focus GUI when text is mapped to a direction key according to an embodiment of the disclosure.

Referring to FIG. 23, operations S2305, S2310, S2315, and S2320 may correspond to operations S1705, S1710, S1715, and S1720 of FIG. 17. Therefore, the description omits redundant descriptions thereof.

The electronic apparatus 100 may identify whether the sub-UI including the text mapped to the direction key is displayed in operation S2325.

In case that the sub-UI including the text mapped to the direction key is not displayed (S2325-N), the electronic apparatus 100 may move and display the focus GUI 10 based on the manipulation direction of the wheel input and the movement direction of the focus GUI 10 in operation S2330.

In case that the sub-UI including the text mapped to the direction key is displayed (S2325-Y), the electronic apparatus 100 may control the focus GUI 10 to not be moved in operation S2335. In detail, the electronic apparatus 100 may control the focus GUI 10 to not be moved at all even based on receiving the wheel input while the sub-UI including the text mapped to the direction key is displayed. The reason is that there is a risk in which the wheel input (e.g., scroll in the upward direction, scroll in the downward direction, scroll in the left direction, or scroll in the right direction) itself may be recognized as inputting the direction key.

Figure 24:
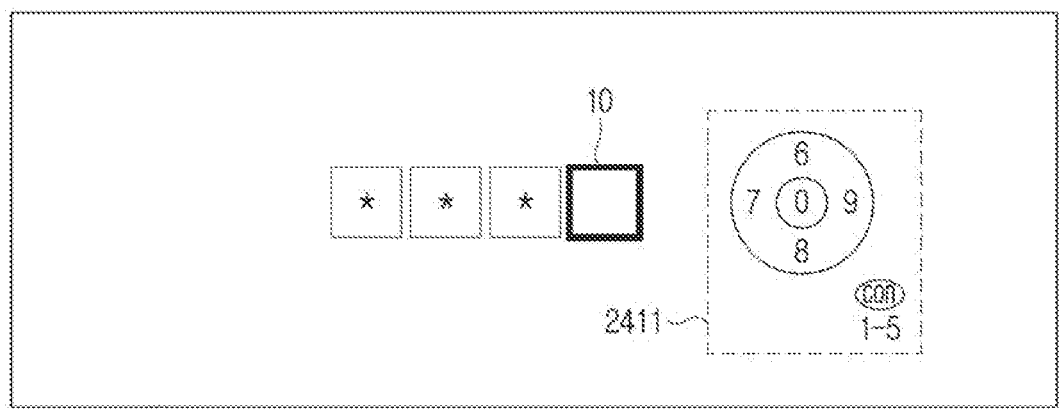
FIG. 24 is a diagram showing an operation of controlling the focus GUI in case that a specific key is mapped to a movement direction of the focus GUI according to an embodiment of the disclosure.
Figure 24:
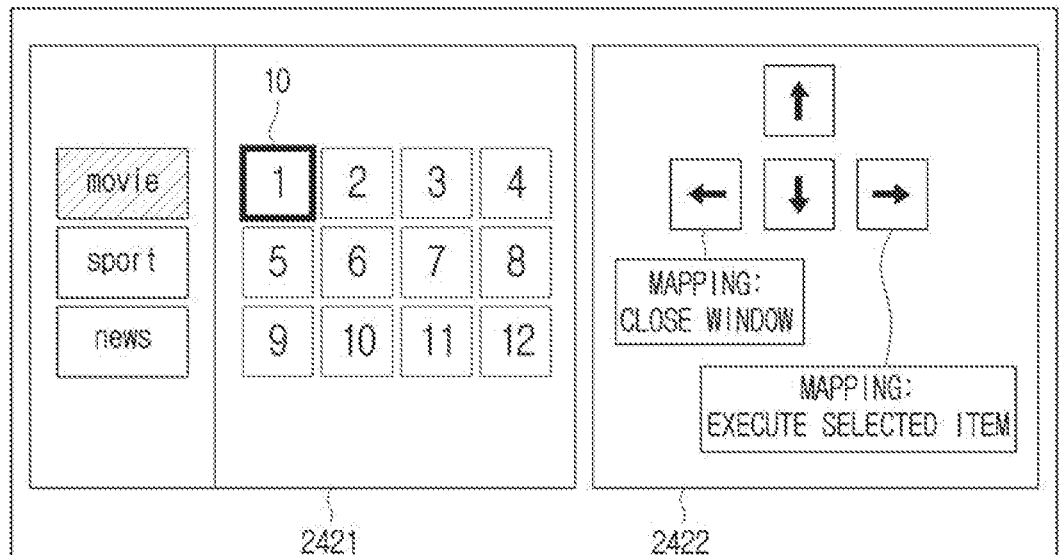

FIG. 24 is a diagram showing an operation of controlling the focus GUI in case that a specific key is mapped to a movement direction of the focus GUI according to an embodiment of the disclosure.

A UI screen 2410 of FIG. 24 may include a GUI item for inputting a password and a sub-UI 2411 including the text mapped to the direction key. The sub-UI 2411 may indicate that the number 6 is mapped to the direction key in the upward direction, the number 8 is mapped to the direction key in the downward direction, the number 7 is mapped to the direction key in the left direction, and the number 9 is mapped to the direction key in the right direction. Additionally, the sub-UI 2411 may indicate that the number zero is mapped to a confirmation key and the numbers 1 to 5 are mapped to a control key. In case that the control key is selected, the electronic apparatus 100 may display a new sub-UI which is different from the sub-UI 2411 and to which the numbers 1 to 5 are mapped. In case that the sub-UI 2411 including the text mapped to the direction key is displayed, the electronic apparatus 100 may control the focus GUI 10 not to be moved.

A UI screen 2420 of FIG. 24 may include a main UI 2421 including the GUI items and a sub-UI 2422 including the text mapped to the direction key. In the sub-UI 2422, a window exit command may be mapped to the direction key in the left direction, and a command to execute a selected item may be mapped to the direction key in the right direction. In case that the sub-UI 2422 including the text mapped to the direction key is displayed, the electronic apparatus 100 may control the focus GUI 10 not to be moved.

Figure 25:
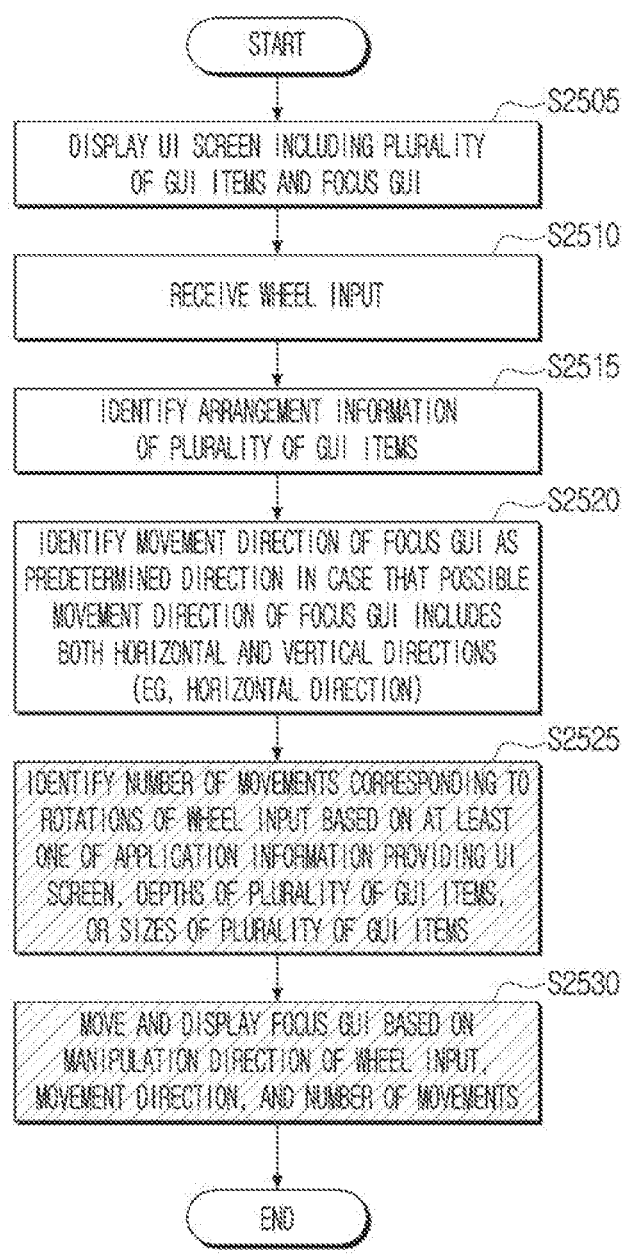
FIG. 25 is a flowchart showing an operation of moving the focus GUI based on at least one of application information, depths of the plurality of GUI items, or sizes of the plurality of GUI items according to an embodiment of the disclosure.

FIG. 25 is a flowchart showing an operation of moving the focus GUI based on at least one of application information, depths of the plurality of GUI items, or sizes of the plurality of GUI items according to an embodiment of the disclosure.

Referring to FIG. 25, operations S2505, S2510, S2515, and S2520 may each correspond to operations S1705, S1710, S1715, and S1720 of FIG. 17. Therefore, the description omits redundant descriptions thereof.

In addition, the electronic apparatus 100 may identify the number of movements corresponding to rotations of the wheel input based on at least one of the application information providing the UI screen, the depths of the plurality of GUI items, and the sizes of the plurality of GUI items in operation S2525. The depth may be referred to as depth information and the size may be referred to as size information.

The electronic apparatus 100 may then move and display the focus GUI 10 based on the manipulation direction of the wheel input, the movement direction of the focus GUI 10, and the number of movements corresponding to the wheel input in operation S2530.

Figure 26:
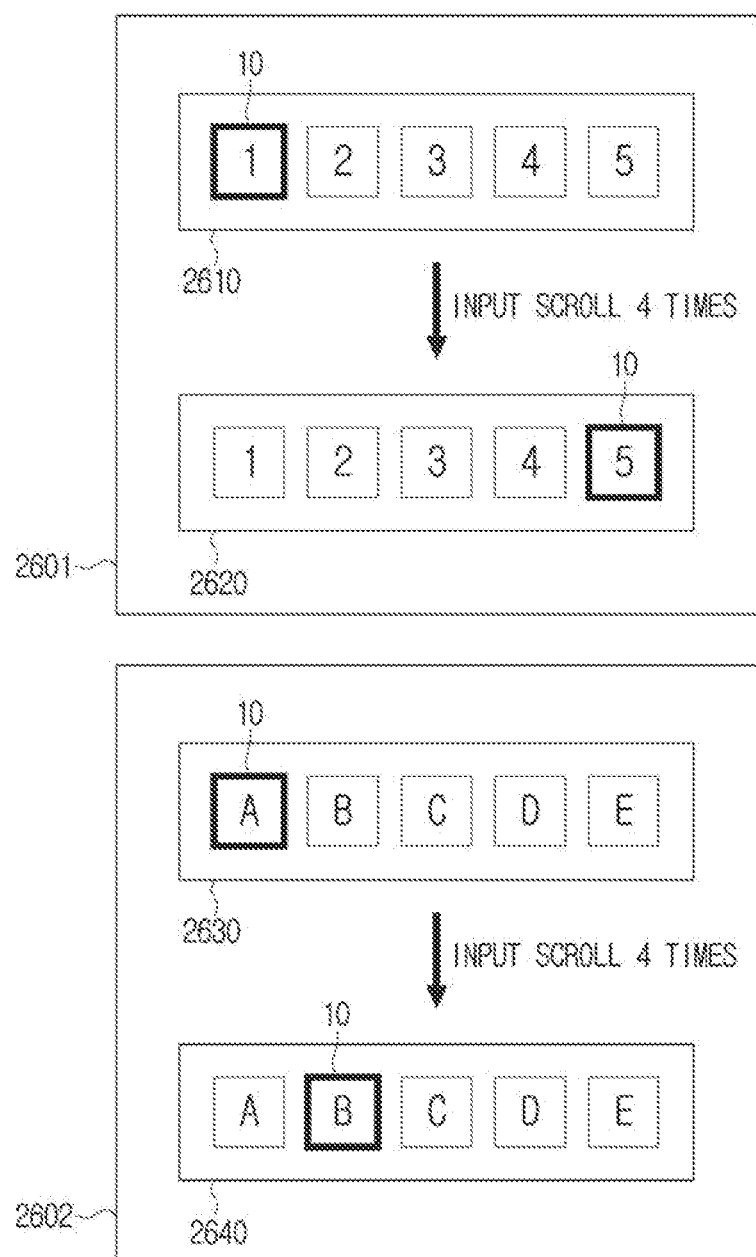
FIG. 26 is a diagram showing an operation of moving the focus GUI based on the number of scrolls according to an embodiment of the disclosure.

FIG. 26 is a diagram showing an operation of moving the focus GUI based on the number of scrolls according to an embodiment of the disclosure.

In example 2601 of FIG. 26, the electronic apparatus 100 may display a UI screen 2610 including a plurality of GUI items (e.g., items 1 to 5) and the focus GUI 10. The focus GUI 10 may be displayed at a location corresponding to item #1. The electronic apparatus 100 may receive the wheel input corresponding to 4 scroll inputs. The electronic apparatus 100 may display a UI screen 2620 on which the focus GUI 10 is displayed at a location corresponding to item #5 that is the fourth item to the right of item #1 based on the movement direction of the focus GUI 10 (e.g., in the horizontal direction).

The number of rotations of the scroll may be the number of rotations of the wheel input. In addition, the number of movement of the focus GUI 10 corresponding to the number of rotations of the wheel input (or the number of rotations of the scroll) may be different based on the application providing the UI screen. In addition, the number of movement of the focus GUI 10 corresponding to the number of rotations of the wheel input (or the number of rotations of the scroll) may be changed based on the user setting. Example 2601 assumes that the number of movement of the GUI item corresponding to one rotation of the wheel input is one. However, example 2602 assumes that the number of movement of the GUI item corresponding to four rotations of the wheel input is one.

In example 2602 of FIG. 26, the electronic apparatus 100 may display a UI screen 2630 including a plurality of GUI items (e.g., items 1 to 5) and the focus GUI 10. The focus GUI 10 may be displayed at a location corresponding to item #1. The electronic apparatus 100 may receive the wheel input corresponding to 4 scroll inputs. The electronic apparatus 100 may display a UI screen 2640 on which the focus GUI 10 is displayed at a location corresponding to item #2 that is the first item to the right of item #1 based on the movement direction of the focus GUI 10 (e.g., in the horizontal direction).

Figure 27:
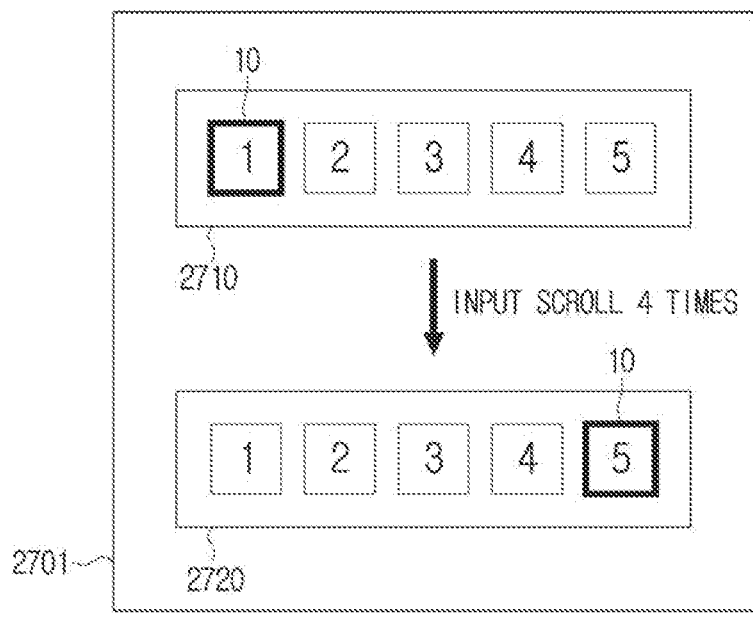
FIG. 27 is a diagram showing an operation of moving the focus GUI based on the size of the GUI item according to an embodiment of the disclosure.
Figure 27:
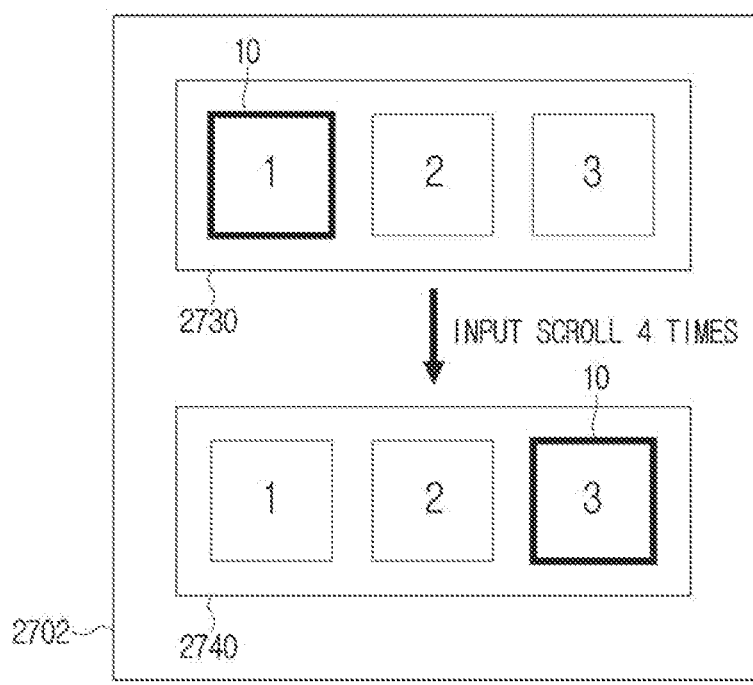

FIG. 27 is a diagram showing an operation of moving the focus GUI based on the size of the GUI item according to an embodiment of the disclosure.

Example 2701 and UI screens 2710 and 2720 of FIG. 27 may each correspond to Example 2601 and UI screens 2610 and 2620 of FIG. 26. Therefore, the description omits redundant descriptions thereof.

The number of movement of the focus GUI 10 corresponding to the number of rotations of the wheel input (or the number of rotations of the scroll) may be different based on the size of the GUI item. The number of movement of the focus GUI 10 corresponding to the number of rotations of the wheel input (or the number of rotations of the scroll) may be smaller as the size of the GUI item is larger. For example, in case that a GUI item of a first size exists, the number of movement of the focus GUI 10 corresponding to the number of rotations of the wheel input (or the number of rotations of the scroll) may be a first value. However, in case that a GUI item of a second size that is twice the first size exists, the number of movement of the focus GUI 10 corresponding to the number of rotations of the wheel input (or the number of rotations of the scroll) may be a second value that is ½ times the first value. That is, the larger the size of the GUI item, the more the user is required to rotate the wheel to move the focus GUI 10.

Referring to example 2702 of FIG. 27, the electronic apparatus 100 may display a UI screen 2730 including a plurality of GUI items (e.g., items 1 to 3) and the focus GUI 10. The focus GUI 10 may be displayed at a location corresponding to item #1. The electronic apparatus 100 may receive the wheel input corresponding to 4 scroll inputs. The electronic apparatus 100 may display a UI screen 2740 on which the focus GUI 10 is displayed at a location corresponding to item #3 that is the third item to the right of item #1 based on the movement direction of the focus GUI 10 (e.g., in the horizontal direction).

FIG. 28 is a diagram showing a control operation corresponding to the wheel input based on an application being executed according to an embodiment of the disclosure.

Referring to table 2810 of FIG. 28, the electronic apparatus 100 may perform channel up/down operations based on receiving the wheel input (in the left/right direction or horizontal direction) while a TV player application is being executed.

The electronic apparatus 100 may also perform the channel up/down operations based on receiving the wheel input (in the left/right direction or horizontal direction) while a setup box (or master boot record (MBR) setup) application is being executed.

The electronic apparatus 100 may also perform volume up/down operations based on receiving the wheel input (in the left/right direction or horizontal direction) while an application displaying a volume UI is being executed.

The electronic apparatus 100 may also perform previous/next song playback operations based on receiving the wheel input (in the left/right direction or horizontal direction) while a music player application is being executed.

The electronic apparatus 100 may also perform fast-forward (FF)/rewind (REW) operations based on receiving the wheel input (in the left/right direction or horizontal direction) while a video player application is being executed.

The electronic apparatus 100 may also perform operations of displaying a previous photo/a next photo based on receiving the wheel input (in the left/right direction or horizontal direction) while a photo application is being executed.

The electronic apparatus 100 may also perform FF/REW operations based on receiving the wheel input (in the left/right direction or horizontal direction) while a content player application is being executed.

The electronic apparatus 100 may also perform scroll operations in the upward direction and the downward direction based on receiving the wheel input (in the left/right direction or horizontal direction) while a web browser application is being executed.

FIG. 28 shows that the wheel input is performed in the horizontal direction. However, the same operation may be applied to the wheel input in the vertical direction in an example.

Figure 29:
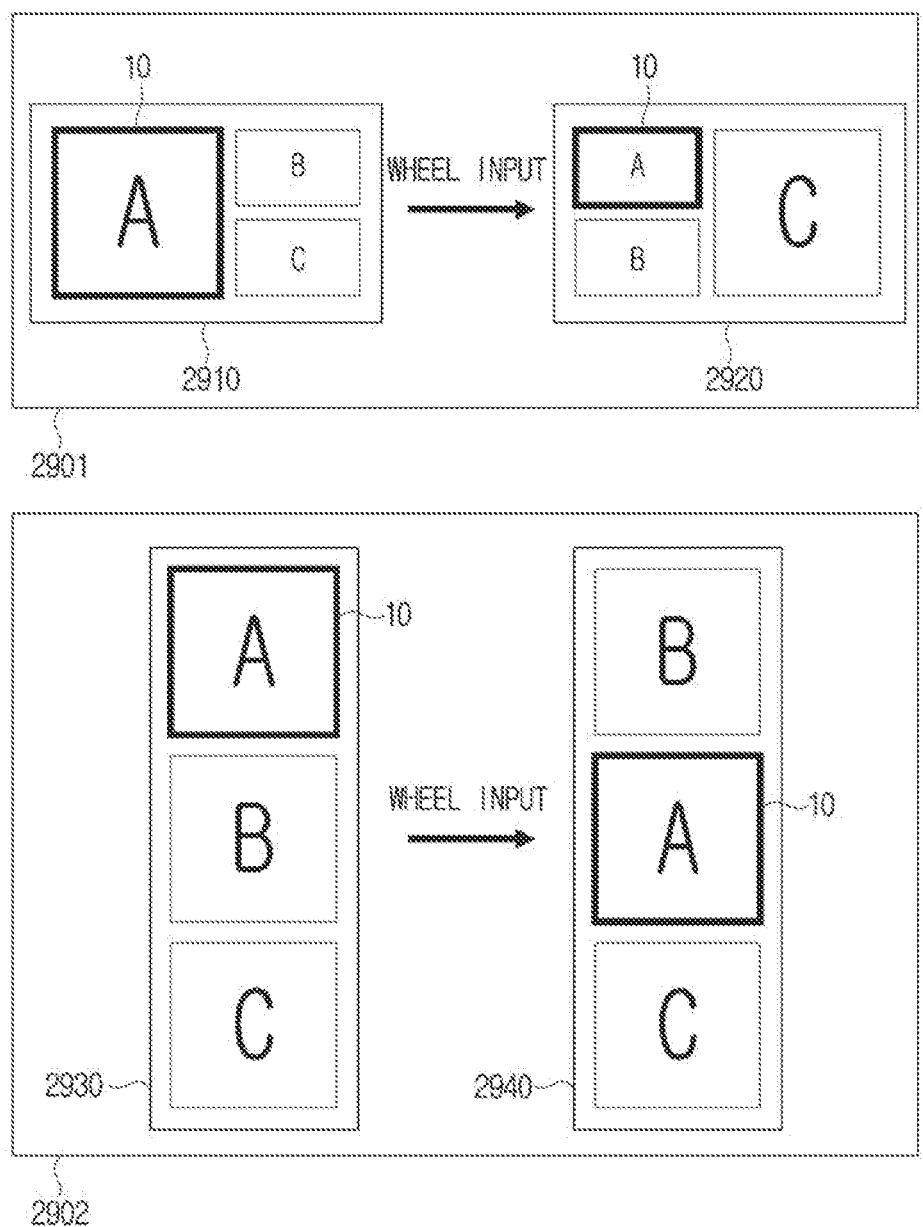
FIG. 29 is a diagram showing an operation of changing a screen on which the GUI item is displayed based on the wheel input according to an embodiment of the disclosure.

FIG. 29 is a diagram showing an operation of changing a screen on which the GUI item is displayed based on the wheel input according to an embodiment of the disclosure.

In example 2901 of FIG. 29, the electronic apparatus 100 may display a UI screen 2910 including a plurality of GUI items (e.g., item "A," item "B," and item "C") and the focus GUI 10. The focus GUI 10 may be displayed at a location corresponding to item "A." The electronic apparatus 100 may receive the wheel input. An application may be executed in which the size of the GUI item is changed without moving the focus GUI 10 based on the wheel input.

In addition, in a state where the application is executed in which the size of the GUI item is changed based on the wheel input, the electronic apparatus 100 may change the size of the GUI item (e.g., item "A") corresponding to the location where the focus GUI 10 is displayed based on the wheel input. It may be assumed that the size of the GUI item becomes smaller based on the wheel input. As the size of GUI items becomes smaller, a layout including the GUI items may be changed. The electronic apparatus 100 may display a UI screen 2920 having the changed layout.

In addition, the electronic apparatus 100 may greatly change a size of another GUI item (e.g., item "C") as the size of the specific GUI item (e.g., item "A") becomes smaller. The electronic apparatus 100 may change the GUI item (e.g., item "B") disposed at a location nearest to the GUI item (e.g., item "A") whose size becomes smaller to the same size as the GUI item (e.g., item "A") whose size becomes smaller. In addition, the electronic apparatus 100 may determine the size of the remaining GUI items (e.g., item "C") based on a size of the remaining region.

In example 2902 of FIG. 29, the electronic apparatus 100 may display a UI screen 2930 including a plurality of GUI items (e.g., item "A," item "B," and item "C") and the focus GUI 10. The focus GUI 10 may be displayed at a location corresponding to item "A." The electronic apparatus 100 may receive the wheel input. An application may be executed in which the sequence of GUI items is changed without moving the focus GUI 10 based on the wheel input.

In addition, in a state where the application is executed in which the sequence of the GUI items is changed based on the wheel input, the electronic apparatus 100 may change the location of the GUI item (item "A") corresponding to the location where the focus GUI 10 is displayed based on the wheel input.

FIG. 30 is a flowchart showing a controlling method of an electronic apparatus according to an embodiment of the disclosure.

Referring to FIG. 30, the controlling method of the electronic apparatus 100 may include displaying a UI screen including a plurality of GUI items and a focus GUI 10 in operation S3005, identifying arrangement information about the plurality of GUI items included in the displayed UI screen based on a wheel input of a user in operation S3010, identifying a possible movement direction of the focus GUI 10 displayed at a location corresponding to one GUI item among the plurality of GUI items based on the arrangement information in operation S3015, identifying a movement direction of the focus GUI 10 as a horizontal direction in case that the identified possible movement direction of the focus GUI 10 includes both the horizontal and vertical directions in operation S3020, and moving and displaying the focus GUI 10 based on a manipulation direction of the wheel input and the identified movement direction in operation S3025.

The moving and displaying of the focus GUI 10 may include identifying the manipulation direction of the wheel input based on receiving the wheel input while the focus GUI is displayed at a first location corresponding to a first GUI item among the plurality of GUI items, moving and displaying the focus GUI at a second location corresponding to a second GUI item displayed on the right of the first GUI item in case that the manipulation direction of the wheel input is a first direction, and moving and displaying the focus GUI at a third location corresponding to a third GUI item displayed on the left of the first GUI item in case that the manipulation direction of the wheel input is a second direction.

The controlling method may further include moving and displaying the focus GUI 10 at the second location corresponding to the second GUI item in case that a depth of the second GUI item is the same as a depth of the first GUI item, and moving and displaying the focus GUI 10 at the third location corresponding to the third GUI item in case that a depth of the third GUI item is the same as the depth of the first GUI item.

The controlling method may further include displaying a UI guiding that the focus GUI 10 is unable to be moved based on the wheel input in case that the depth of the second GUI item is different from the depth of the first GUI item, and displaying the UI guiding that the focus GUI 10 is unable to be moved based on the wheel input in case that the depth of the third GUI item is different from the depth of the first GUI item.

The arrangement information may include at least one of an arrangement shape of the plurality of GUI items or an arrangement location of the plurality of GUI items.

In the moving and displaying of the focus GUI 10, the focus GUI 10 may be moved and displayed based on priority information and the manipulation direction of the wheel input in case that the arrangement information includes the priority information for each of the plurality of GUI items.

In the identifying of the possible movement direction of the focus GUI 10, identification information about an application providing the UI screen may be acquired based on a predetermined event, and the movement direction of the focus GUI 10 may be identified as the horizontal direction based on the identification information about the application.

In the moving and displaying of the focus GUI 10, the focus GUI 10 may be moved and displayed upward or downward based on the manipulation direction of the wheel input in case that the identified possible movement direction of the focus GUI 10 is the vertical direction, and the focus GUI 10 may be moved and displayed on the left or right based on the manipulation direction of the wheel input in case that the identified possible movement direction of the focus GUI 10 is the horizontal direction.

The controlling method may further include controlling not to move the focus GUI 10 based on the wheel input in case that a sub-UI including text mapped to a direction key is displayed on the UI screen.

The wheel input may be received through at least one of a wheel button or a touch panel.

The method in the various examples of the disclosure described above may be implemented in the form of an application which may be installed on the existing electronic apparatus.

In addition, the method in the various examples of the disclosure described above may be implemented only by software upgrade or hardware upgrade for the existing electronic apparatus.

In addition, the various embodiments of the disclosure described above may be performed through an embedded server included in the electronic apparatus, or an external server of at least one of the electronic apparatus or a display device.

According to an embodiment of the disclosure, the various examples described above may be implemented by software including an instruction stored in a machine-readable storage medium (for example, a computer-readable storage medium). A machine may be a device that invokes the stored instruction from the storage medium and operates based on the invoked instruction, and may include the electronic apparatus in the disclosed examples. In case that the instruction is executed by the processor, the processor may directly perform a function corresponding to the instruction or other components may perform the function corresponding to the instruction under a control of the processor. The instruction may include codes provided or executed by a compiler or an interpreter. The machine-readable storage medium may be provided in the form of a non-transitory storage medium. The term "non-transitory" indicates that the storage medium is tangible without including a signal, and does not divide whether data are semi-permanently or temporarily stored in the storage medium.

In addition, according to various embodiments of the disclosure, the method in the various examples described above may be provided by being included in a computer program product. The computer program product may be traded as a product between a seller and a purchaser. The computer program product may be distributed in a form of a storage medium (for example, a compact disc read only memory (CD-ROM)) that may be read by the machine or online through an application store (for example, Play-Store™). In the case of the online distribution, at least portions of the computer program product may be at least temporarily stored in a storage medium such as a memory of a server of a manufacturer, a server of an application store or a relay server, or be temporarily provided.

In addition, each of the components (for example, modules or programs) according to the various embodiments described above may include a single entity or a plurality of entities, and some of the corresponding sub-components described above may be omitted or other sub-components may be further included in the various embodiments. Alternatively or additionally, some of the components (for example, the modules or the programs) may be integrated into one entity, and may perform functions performed by the respective corresponding components before being integrated in the same or similar manner. Operations performed by the modules, the programs or other components according to the various embodiments may be executed in a sequential manner, a parallel manner, an iterative manner or a heuristic manner, at least some of the operations may be performed in a different order or be omitted, or other operations may be added.

Although the embodiments of the disclosure are shown and described hereinabove, the disclosure is not limited to the above-mentioned specific embodiments, and may be variously modified by those skilled in the art to which the disclosure pertains without departing from the scope and spirit of the disclosure as disclosed in the accompanying claims. These modifications also need to be understood to fall within the scope of the disclosure.

What is claimed is:

1. An electronic apparatus comprising:
   a display; and
   a processor configured to:
   control the display to display a user interface (UI) screen comprising a plurality of graphic user interface (GUI) items comprising a first group of GUI items at a first depth and a second group of GUI items at a second depth, and a focus GUI on a first GUI item among the first group of GUI items,
   identify arrangement information about the plurality of GUI items,
   in response to a wheel input of a user being received while the focus GUI is located on the first GUI item among the first group of GUI items, identify an acceleration of the wheel input,
   in response to the acceleration of the wheel input being less than a threshold value, identify a movement direction of the focus GUI based on a manipulation direction of the wheel input and the identified arrangement information on the first group of GUI items, and control the display to move the focus GUI from being on the first GUI item to being on a second GUI item among the first group of GUI items, and
   in response to the acceleration of the wheel input being the threshold value or more, control the display to move the focus GUI from being on the first GUI item among the first group of GUI items to being on a third GUI item among the second group of GUI items at the second depth.

2. The electronic apparatus of claim 1, wherein the processor is further configured to:
   in response to the wheel input of the user while the focus GUI is displayed at a first location corresponding to the first GUI item among the first group of GUI items, identify the manipulation direction of the wheel input,
   identify the movement direction of the focus GUI based on the manipulation direction of the wheel input and the identified arrangement information on the first group of GUI items, and
   control the display to move the focus GUI from the first location corresponding to the first GUI item to a second location corresponding to the second GUI item.

3. The electronic apparatus of claim 1, wherein the arrangement information comprises at least one of an arrangement shape of the plurality of GUI items and an arrangement location of the plurality of GUI items.

4. The electronic apparatus of claim 1, wherein the processor is further configured to:
   based on the arrangement information comprising priority information for each of the plurality of GUI items, control the display to move the focus GUI based on the priority information for each of the plurality of GUI items and the manipulation direction of the wheel input.

5. The electronic apparatus of claim 1, wherein the processor is further configured to:
   acquire identification information about an application providing the UI screen based on a predetermined event, and
   identify the movement direction of the focus GUI as a horizontal direction based on the identification information about the application.

6. The electronic apparatus of claim 1, wherein the processor is further configured to:
   identify, based on the arrangement information, a possible movement direction of the focus GUI displayed at a location corresponding to one GUI item among the plurality of GUI items,
   based on the identified possible movement direction of the focus GUI being a vertical direction, control the display to move the focus GUI upward or downward according to the manipulation direction of the wheel input, and
   based on the identified possible movement direction of the focus GUI being a horizontal direction, control the display to move the focus GUI to left or right according to the manipulation direction of the wheel input.

7. The electronic apparatus of claim 1, wherein the processor is further configured to, based on a sub-UI comprising text mapped to a direction key being displayed on the UI screen, control the display to not move the focus GUI based on the wheel input.

8. The electronic apparatus of claim 1, wherein the wheel input is received through at least one of a wheel button and a touch panel.

9. The electronic apparatus of claim 1, wherein a number of movements of the focus GUI corresponds to a number of rotations of the wheel input.

10. The electronic apparatus of claim 1, wherein the processor is further configured to:
    in response to the wheel input of the user being received while the focus GUI is located on the first GUI item among the first group of GUI items, control the display to move the focus GUI only to a location corresponding to GUI item having the first depth corresponding to the first GUI item.

11. A controlling method of an electronic apparatus, the method comprising:
    displaying a user interface (UI) screen comprising a plurality of graphic user interface (GUI) items comprising a first group of GUI items at a first depth and a second group of GUI items at a second depth, and a focus GUI on a first GUI item among the first group of GUI items,
    identifying arrangement information about the plurality of GUI items,
    in response to a wheel input of a user being received while the focus GUI is located on the first GUI item among the first group of GUI items, identify an acceleration of the wheel input,
    in response to the acceleration of the wheel input being less than a threshold value, identifying a movement direction of the focus GUI based on a manipulation direction of the wheel input and the identified arrangement information on the first group of GUI items, and moving the focus GUI from being on the first GUI item to being on a second GUI item among the first group of GUI items, and in response to the acceleration of the wheel input being the threshold value or more, moving the focus GUI from being on the first GUI item among the first group of GUI items to being on a third GUI item among the second group of GUI items at the second depth.

12. The method of claim 11, wherein the identifying the movement direction of the focus GUI comprises:
in response to the wheel input of the user while the focus GUI is displayed at a first location corresponding to the first GUI item among the first group of GUI items, identifying the manipulation direction of the wheel input, and
identifying the movement direction of the focus GUI based on the manipulation direction of the wheel input and the identified arrangement information on the first group of GUI items,
wherein the moving of the focus GUI comprises:
moving the focus GUI from the first location corresponding to the first GUI item to a second location corresponding to the second GUI item.

13. The method of claim 11, wherein the arrangement information comprises at least one of an arrangement shape of the plurality of GUI items and an arrangement location of the plurality of GUI items.

14. The method of claim 11, wherein a number of movements of the focus GUI corresponds to a number of rotations of the wheel input.

15. The method of claim 11, wherein the moving of the focus GUI comprises:
in response to the wheel input of the user being received while the focus GUI is located on the first GUI item among the first group of GUI items, moving the focus GUI only to a location corresponding to GUI item having the first depth corresponding to the first GUI item.

16. A non-transitory computer-readable storage medium storing instructions that, when executed by at least one processor, cause the at least one processor to:
control a display to display a user interface (UI) screen comprising a plurality of graphic user interface (GUI) items comprising a first group of GUI items at a first depth and a second group of GUI items at a second depth, and a focus GUI on a first GUI item among the first group of GUI items,
identify arrangement information about the plurality of GUI items, in response to a wheel input of a user being received while the focus GUI is located on the first GUI item among the first group of GUI items, identify an acceleration of the wheel input,
in response to the acceleration of the wheel input being less than a threshold value, identify a movement direction of the focus GUI based on a manipulation direction of the wheel input and the identified arrangement information on the first group of GUI items, and control the display to move the focus GUI from being on the first GUI item to being on a second GUI item among the first group of GUI items, and
in response to the acceleration of the wheel input being the threshold value or more, control the display to move the focus GUI from being on the first GUI item among the first group of GUI items to being on a third GUI item among the second group of GUI items at the second depth.

17. The storage medium of claim 16, wherein the instructions, when executed, further cause the at least one processor to:
in response to the wheel input of the user while the focus GUI is displayed at a first location corresponding to the first GUI item among the first group of GUI items, identify the manipulation direction of the wheel input,
identify the movement direction of the focus GUI based on the manipulation direction of the wheel input and the identified arrangement information on the first group of GUI items, and
control the display to move the focus GUI from the first location corresponding to the first GUI item to a second location corresponding to the second GUI item.

18. The storage medium of claim 16, wherein the arrangement information comprises at least one of an arrangement shape of the plurality of GUI items and an arrangement location of the plurality of GUI items.

19. The storage medium of claim 16, wherein a number of movements of the focus GUI corresponds to a number of rotations of the wheel input.

20. The storage medium of claim 16, wherein the instructions, when executed, further cause the at least one processor to:
in response to the wheel input of the user being received while the focus GUI is located on the first GUI item among the first group of GUI items, control the display to move the focus GUI only to a location corresponding to GUI item having the first depth corresponding to the first GUI item.

* * * * *